(12) United States Patent
Hosotani et al.

(10) Patent No.: US 8,553,450 B2
(45) Date of Patent: Oct. 8, 2013

(54) MAGNETIC RANDOM ACCESS MEMORY AND WRITE METHOD OF THE SAME

(75) Inventors: Keiji Hosotani, Palo Alto, CA (US); Masahiko Nakayama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 770 days.

(21) Appl. No.: 12/510,063

(22) Filed: Jul. 27, 2009

(65) Prior Publication Data

US 2010/0020592 A1 Jan. 28, 2010

(30) Foreign Application Priority Data

Jul. 25, 2008 (JP) .................................. 2008-192529

(51) Int. Cl.
*G11C 11/00* (2006.01)
(52) U.S. Cl.
USPC ....... 365/158; 365/171; 365/173; 365/189.16
(58) Field of Classification Search
USPC .............................. 365/158, 171, 173, 189.16
See application file for complete search history.

(56) References Cited

U.S. PATENT DOCUMENTS

| | | | |
|---|---|---|---|
| 6,829,162 B2 | 12/2004 | Hosotani | |
| 6,853,580 B2 * | 2/2005 | Nishimura | 365/158 |
| 6,888,742 B1 * | 5/2005 | Nguyen et al. | 365/158 |
| 6,898,115 B2 * | 5/2005 | Ikeda | 365/171 |
| 6,914,810 B2 | 7/2005 | Hosotani | |
| 7,068,531 B2 * | 6/2006 | Katti | 365/158 |
| 7,239,545 B2 * | 7/2007 | Hosotani | 365/171 |
| 7,630,232 B2 * | 12/2009 | Guo | 365/158 |
| 7,881,096 B2 * | 2/2011 | Zhu et al. | 365/148 |
| 2009/0091863 A1 | 4/2009 | Hosotani et al. | |

FOREIGN PATENT DOCUMENTS

JP 2007-305629 11/2007

OTHER PUBLICATIONS

Scheuerlein et al., "A 10ns Read and Write Non-Volatile Memory Array Using a Magnetic Tunnel Junction and FET Switch in Each Cell," ISSCC 2000 Technical Digest, p. 128, Aug. 2000.
Jeong et al., "Highly Scalable MRAM Using Field Assisted Current Induced Switching," 2005 Symposium on VLSI Technology Digest of Technical Papers, pp. 184-185, Jul. 2009.
Mangin et al., "Current-Induced Magnetization Reversal in Nanopillars with Perpendicular Anisotropy," Nature Materials vol. 5, Mar. 2006, pp. 210-215.
Yuasa et al., "Giant Tunneling Magnetoresistance in Fully Epitaxial Body-Centered-Cubic Co/MgO/Fe Magnetic Tunnel Junctions," Applied Physics Letters 87, 222508, May 2005.

(Continued)

*Primary Examiner* — Pho M Luu
(74) *Attorney, Agent, or Firm* — Knobbe, Martens, Olson & Bear LLP

(57) ABSTRACT

A first magnetic layer has a magnetization fixed along one direction. A first nonmagnetic layer on the first magnetic layer functions as a first tunnel barrier. A second magnetic layer on the first nonmagnetic layer has a magnetization whose direction can be reversed by spin transfer current injection. A second nonmagnetic layer on the second magnetic layer functions as a second tunnel barrier. A third magnetic layer on the second nonmagnetic layer has a magnetization whose direction can be reversed by spin transfer through current injection at a current density different from the second magnetic layer. First magnetic, first nonmagnetic layer, and second magnetic layers exhibit a first magnetoresistive effect. Second magnetic, second nonmagnetic, and third magnetic layers exhibit a second magnetoresistive effect. A magnetoresistive effect element records and reads out data of at least three levels based on a synthetic resistance from the first and second magnetoresistive effects.

20 Claims, 16 Drawing Sheets

(56) References Cited

OTHER PUBLICATIONS

Tsunekawa et al., "Giant Tunneling Magnetoresistance Effect in Low-Resistance CoFeB/MgO(001)/CoFeB Magnetic Tunnel Junctions for Read-Head Applications," Applied Physics Letter 87, 072503, May 2005.

Kubota et al., "Evaluation of Spin-Transfer Switching in CoFeB/MgO/CoFeB Magnetic Tunnel Junctions," Japanese Journal of Applied Physics vol. 44, No. 40, pp. L1237-L1240, Aug. 2005.

Diao et al., "Spin Transfer Switching and Spin Polarization in Magnetic Tunnel Junctions with MgO and AlOx barriers," Applied Physics Letters 87, 232502 (2005), Jul. 2006.

Hosomi et al., "A Novel Nonvolatile Memory with Spin Torque Transfer Magnetization Switching: Spin-RAM," IEDM 2005 Proceedings, Aug. 2005.

Explanation of Non Patent Literature Documents, Jul. 2009.

Japanese Office Action for corresponding Japanese Application No. JP 2008-192529, mailed Jan. 22, 2013, in 6 pages.

\* cited by examiner

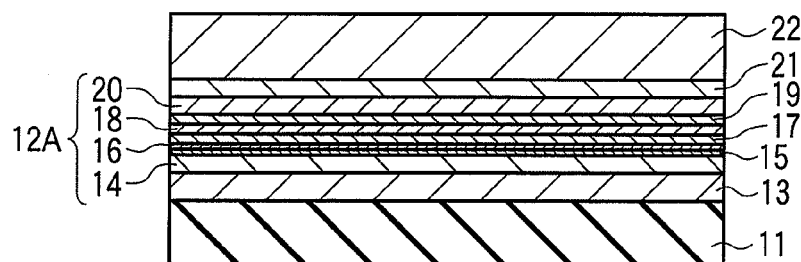
F I G. 4A
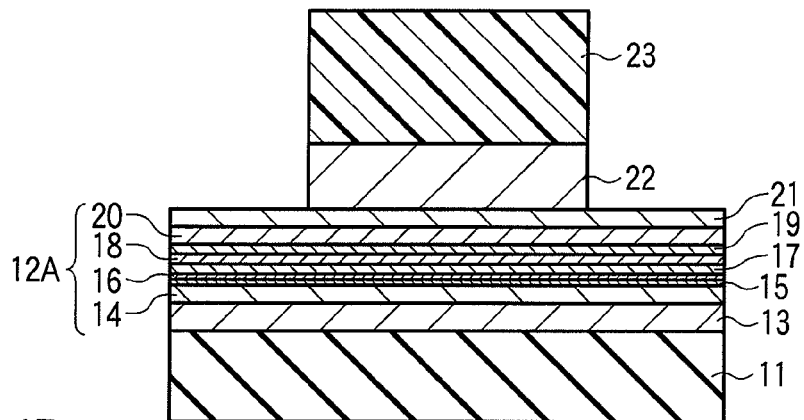
F I G. 4B
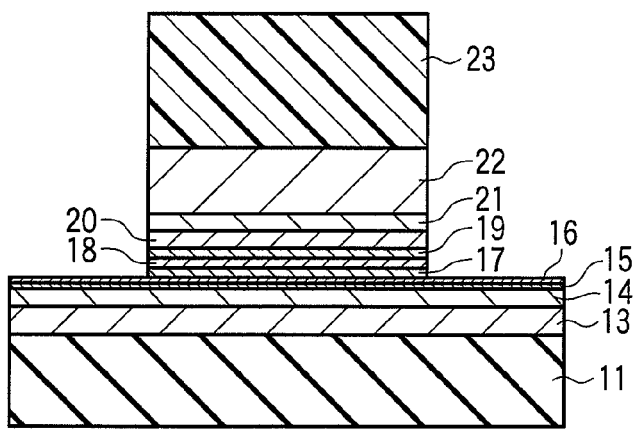
F I G. 4C
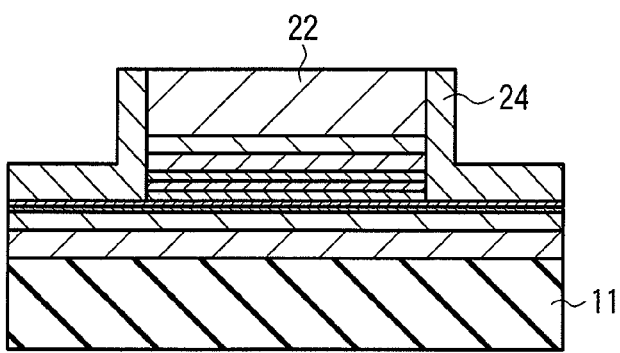
F I G. 4D

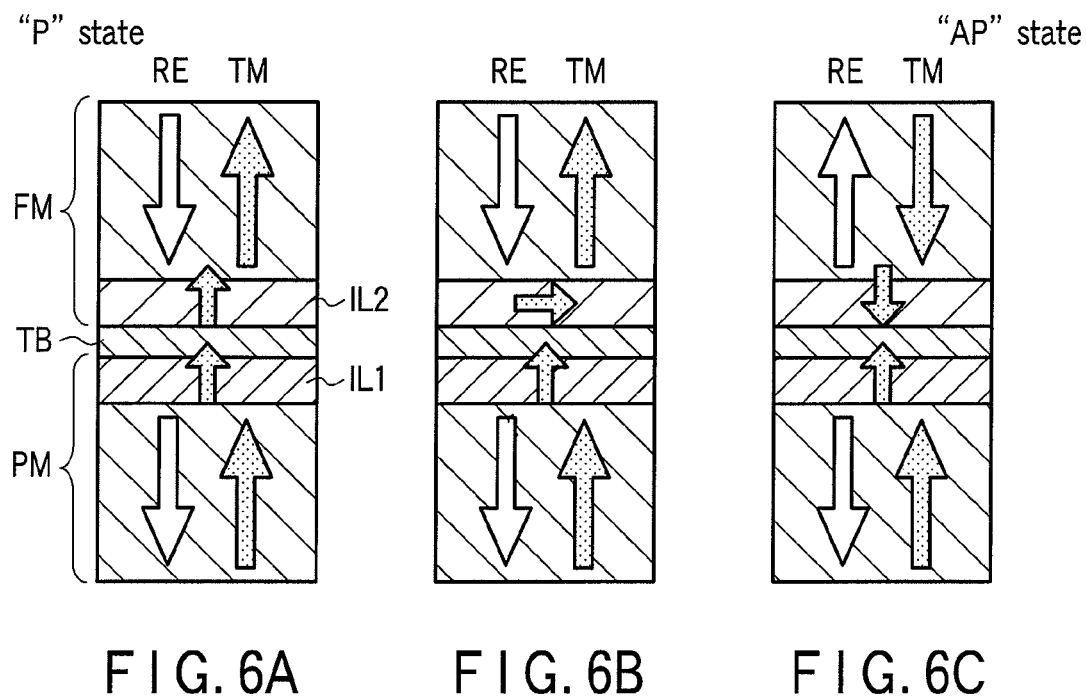
F I G. 6A  F I G. 6B  F I G. 6C
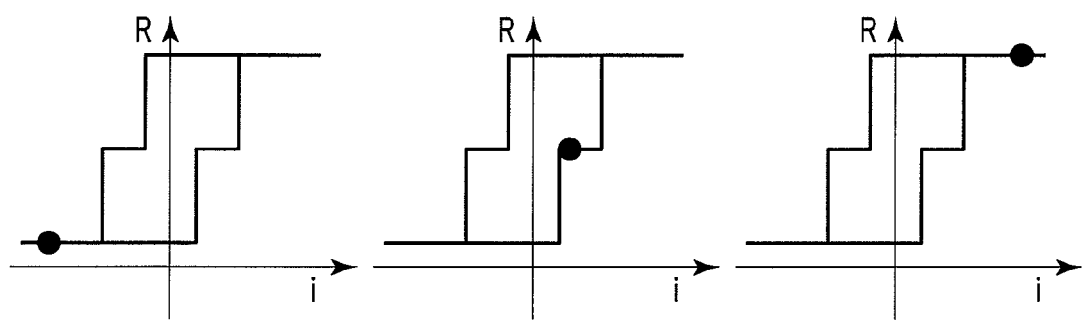
F I G. 7A  F I G. 7B  F I G. 7C

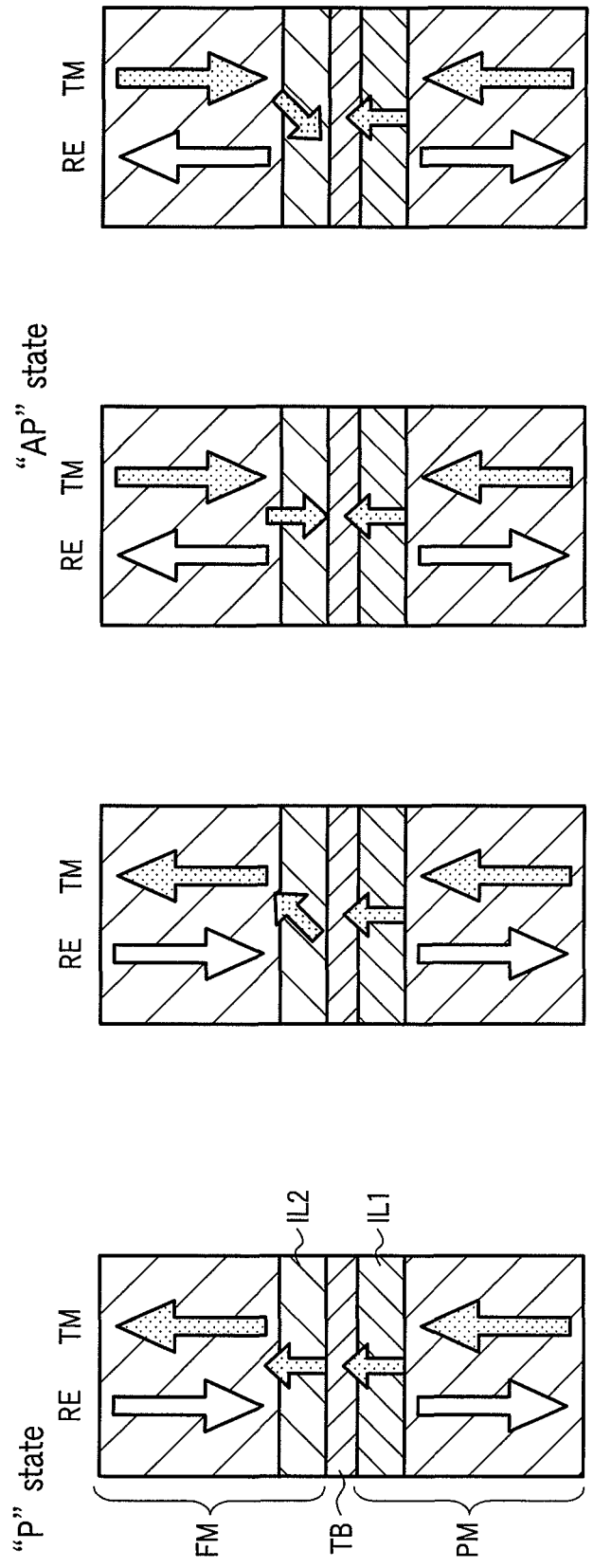

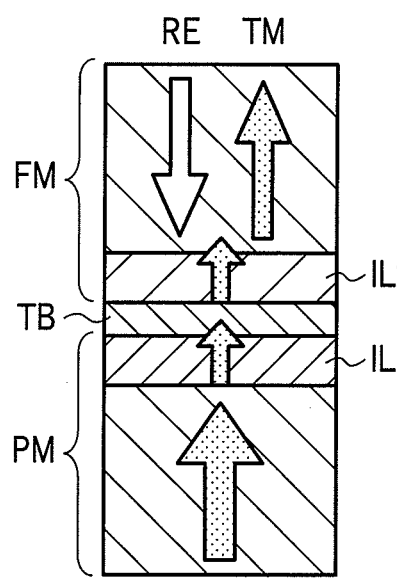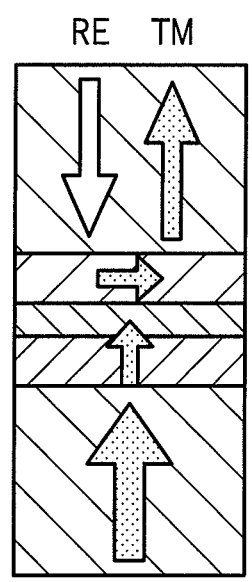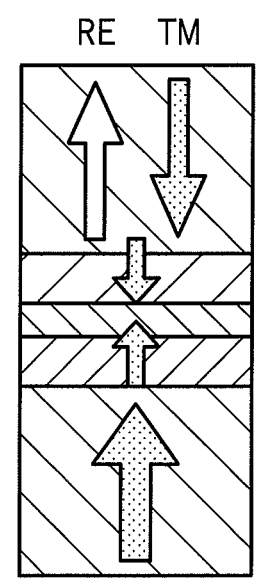
F I G. 16A  F I G. 16B  F I G. 16C

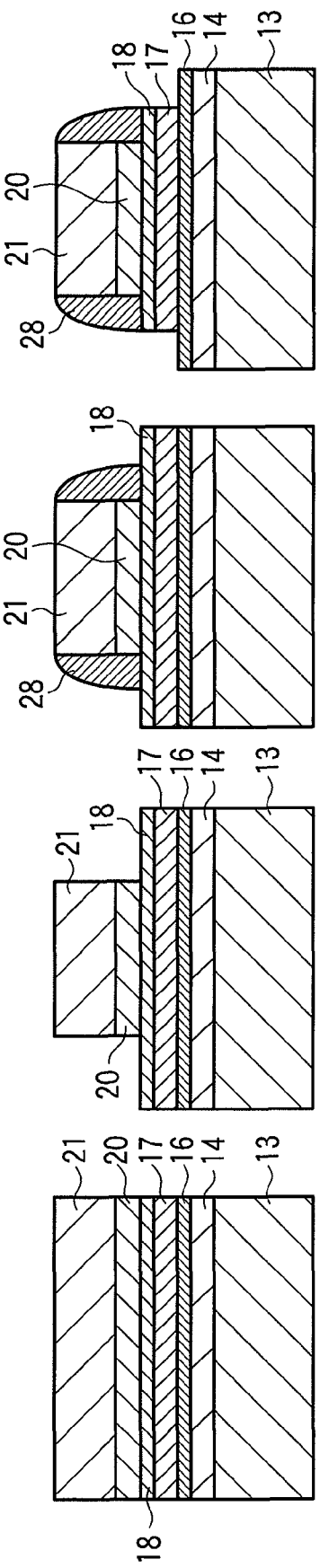

MAGNETIC RANDOM ACCESS MEMORY AND WRITE METHOD OF THE SAME

CROSS-REFERENCE TO RELATED APPLICATIONS

This application is based upon and claims the benefit of priority from prior Japanese Patent Application No. 2008-192529, filed Jul. 25, 2008, the entire contents of which are incorporated herein by reference.

BACKGROUND OF THE INVENTION

1. Field of the Invention

The present invention relates to a magnetoresistive (MR) element that stores data of "1" or "0" using the magnetoresistive effect and a magnetic random access memory (MRAM) in which a memory cell is configured by applying such a function of the MR element and, more particularly, to a spin-transfer multilevel MRAM and a write method of the same.

2. Description of the Related Art

Research for putting a magnetic random access memory using the tunneling magnetoresistive (TMR) effect into practical use is being extensively made all over the world. Freescale Semiconductor of the U.S. has applied the technique for mass production and sells MRAM chips so far although the scale is as small as 4 Mbits (see, e.g., ISSCC 2000 Technical Digest, p. 128, "A 10 ns Read and Write Non-Volatile Memory Array Using a Magnetic Tunnel Junction and FET Switch in each Cell").

According to the Julliere's model, the TMR effect of a magnetic tunnel junction (MTJ) is explained as follows: Based on the assumption that the direction of electron spins remain unchanged during the tunneling process, when magnetizations of two ferromagnetic electrodes, which sandwich a nonmagnetic layer, are directed parallel, majority-spin electrons tunnel into the majority-spin band of the other electrode, or minority-spin electrons tunnel into the minority-spin band of the other electrode.

On the contrary, when magnetizations of the ferromagnetic electrodes are directed antiparallel, the majority-spin (or minority-spin) electrons tunnel into the minority-spin (or majority-spin) band of the other electrode.

This makes a tunnel resistance (Rp) with the parallel magnetization different from a tunnel resistance (Rap) with the antiparallel magnetization. The ratio of change (the magnetoresistive effect ratio, or MR ratio) is represented by $$MR\ \text{ratio} = (Rap-Rp)/Rp = 2P_1P_2/(1-P_1P_2)$$

$$P_\alpha = (D_\alpha\uparrow(Ef) - D_\alpha\downarrow(Ef))/(D_\alpha\uparrow(Ef) + D_\alpha\downarrow(Ef)),\ \alpha=1,2$$

where P is a spin polarization ratio. P is defined as the state density $D\uparrow(Ef)$ of the majority-spin band and the state density $D\downarrow(Ef)$ of the minority-spin band at the Fermi level Ef of the electrode.

In 1995, an MTJ element with alumina used as a tunnel barrier layer and a polycrystalline transition metal ferromagnetic material as an electrode layer was manufactured in Tohoku University. This MTJ element attracted a great deal of attention because it achieved an MR ration of 18% at room temperature, which was a very high MR ratio at that time.

In an MRAM, recorded data is read by detecting the change in resistance of an MTJ element caused by the TMR effect. A memory cell is designed such that the magnetization direction in one ferromagnetic layer of the MTJ element is fixed along one direction (this layer is also called a fixed layer or pinned layer), and the other magnetic layer (also called a recording layer or free layer) is given uniaxial anisotropy in the same direction as the fixed layer, and its magnetization can be reversed to be from/to parallel and to/from antiparallel to the fixed layer by a relatively weak external magnetic field. Hence, selective writing to the memory cell is possible.

When configuring a memory cell array, bit lines and word lines are arranged to be perpendicular to each other, and the MTJ element serving as a memory cell is placed at each intersection of these lines. A current is supplied to a bit line and word line corresponding to a selected memory cell, thereby generating a current magnetic field. Consequently, data can be written in only the memory cell at the intersection of the selected word line and selected bit line.

In general, the MTJ element is given shape magnetic anisotropy by making it a rectangle or ellipse in its planar shape, and is also given a resistance to the thermal disturbance by defining the magnetization direction of the element. The product of the sum of the shape magnetic anisotropic energy and induced magnetic anisotropic energy of the MTJ element and the volume of the free layer of the MTJ element is Ku×V. The induced magnetic anisotropy of the free layer of the MTJ element is aligned with the shape anisotropy, thereby preventing dispersion of the anisotropies.

The magnitude, however, of the induced magnetic anisotropy of NiFe for the free layer (a few Oe) is generally smaller than that of the shape anisotropic magnetic field (a few tens of Oe) by an order of magnitude, therefore the magnetic shape anisotropy presumably plays the most part in determining almost determines the thermal disturbance resistance and a switching magnetic field.

The switching magnetic field Hsw required to rewrite information held through magnetization in the free layer is generally given by $$Hsw = 4\pi \times Ms \times t/F\ (Oe) \quad (2)$$

where Ms is the saturation magnetization of the free layer, t is the thickness of the free layer, and F is the width of the free layer. The sum Ku of the magnetic shape anisotropic energy and induced magnetic anisotropic energy is generally given by $$Ku = Hsw \times Ms/2 \quad (3)$$

As can be seen, the width F of the free layer must be decreased in order to reduce the cell size of the conventional magnetic-field-writing MRAM cell.

Unfortunately, there is a lower limit of the thickness t of the free layer regarding the reliability issues, resulting in large Hsw and an accordingly large write current, which imposes a limit on miniaturization.

An MRAM using the operating principle of spin-transfer magnetization switching is expected as a technique that solves such a problem and realizes a larger scale memory. For such a spin-transfer-magnetization-switching MRAM, electrons having the same spin direction as the fixed layer are conducted from the fixed layer to the free layer having spins of the opposite direction in order to switch the antiparallel state to the parallel state. When the current density exceeds JcP→AP, magnetization reversal of the whole free layer is occurred, resulting in the parallel state.

By contrast, in order to switch the parallel state to the antiparallel state, electrons having the same direction as the fixed layer are conducted from the free layer to the fixed layer. As a result, electrons which have been reflected and have spins of the opposite direction to the spin direction of electrons in the free layer enters the free layer. When the current density exceeds JcAP→P, magnetization reversal of the whole free layer is occurred, resulting in the antiparallel state.

As the reading operation is the same with a conventional MRAM cell having the TMR structure in which the magnetic field is used for writing, memory cell data can be read out by reading the change of the cell resistance.

When using the spin-transfer TMR structure for an MRAM cell, current densities JcP→AP and JcAP→P required for magnetization switching are determined by the type, anisotropy, and thickness of materials for the fixed layer and free layer, etc. Therefore, the smaller the elements are, the smaller the total current required for writing and it can be said that this nature is suitable for device scaling.

Such a memory cell for the spin-transfer MRAM requires only two terminals for the reading and writing. This simple requirement can realize simplified memory cell configuration and increased density of memory cells because no write word line is necessary.

In a recently reported spin-transfer MRAM, a current is conducted perpendicularly to the TMR-effect-exhibiting films (the TMR structure) to inject spins of selected direction into the free layer in order to reverse the magnetization direction. When used for a spin transfer MRAM cell, a perpendicular magnetization film only needs to have uniaxial anisotropy perpendicular to the film plain surface (film surface), and has no needs to have shape magnetic anisotropy along the in-plan direction.

In principle, therefore, the MTJ element can have aspect ratio of 1, and can be small as possible as defined by the processing limit. Also, this MTJ element does not need the interconnects for generating the biaxial current magnetic fields along the direction parallel to the film surface (in-plane direction), and can be operated as long as the two terminals connected to the upper and lower electrodes of the TMR structure are provided. Accordingly, the cell area per bit can be reduced (see, e.g., W. C. Jeong et al., "High scalable MRAM using field assisted current induced switching", 2005 VLSI Sympo. Technical Digest, pp. 184-185).

The switching current for the spin transfer for the in-plane-magnetization film in the above-mentioned TMR structure is given by $$I_C^{P-AP} \approx \frac{A\alpha M_S V}{g(0)p}(H + H_{dip} + H_{k//} + 2\pi M_S) \quad (4)$$

$$I_C^{AP-P} \approx \frac{A\alpha M_S V}{g(\pi)p}(H + H_{dip} - H_{k//} - 2\pi M_S) \quad (5)$$

Where Ms is the saturation magnetization of the free layer, V is the volume of the free layer, α is the Gilbert damping constant of the free layer, A is a constant relating to a transport model, H is an magnetic field (in the in-plane direction) applied to the wafer, Hdip is a leakage magnetic field (in the in-plane direction) from the fixed layer, P is the spin polarization ratio, Hk// is the anisotropic magnetic field (in the in-plane direction), and g is a coefficient relating to the relative angle between the free and fixed layers.

On the other hand, the switching current for the spin transfer for the perpendicular-magnetization film in the TMR structure is given by $$I_C^{P-AP} \approx \frac{A\alpha M_S V}{g(0)p}(H_{k\perp} - 4\pi M_S - H - H_{dip}) \quad (6)$$

$$I_C^{AP-P} \approx \frac{A\alpha M_S V}{g(\pi)p}(-H_{k\perp} + 4\pi M_S - H - H_{dip}) \quad (7)$$

Where Ms is the saturation magnetization of the free layer, V is the volume of the free layer, α is the Gilbert damping constant of the free layer, A is a constant relating to a transport model, H is an magnetic field (in the perpendicular direction) applied to the wafer, Hdip is a leakage magnetic field (in the perpendicular direction) from the fixed layer, P is the spin polarization ratio, Hk⊥ is the anisotropic magnetic field (in the perpendicular direction), and g is a coefficient relating to the relative angle between the free and fixed layers (see, e.g., S. Mangin et al., Nature Materials, Vol. 5, Mar 2006).

As can be seen, the spin switching current Ic is an important parameter in the spin-transfer MRAM.

Recently, it has been theoretically and experimentally verified that polycrystalline MgO with (001) crystal surface is sandwiched by polycrystalline CoFeB also with (001) crystal surface to form CoFeB(001)/MgO(001)/CoFeB(001) structure for a TMR tunnel barrier, and such a structure used as a TMR tunnel barrier can function as a spin filter which allows only Δ1 electrons (or, s-electrons)to penetrate it, which is called the coherent tunneling. As a result, this material is found to be a material system that can greatly contribute not only to achievement of a high TMR but also to improvement of spin injection efficiency, and therefore is expected to be put into practical use as an unnecessary material for the spin-transfer MRAM (see S. Yuasa et al., Appl. Phys. Lett. 87, 222508 (2005), K. Tsunekawa et al., "Giant Magnetoresistance Tunneling effect in low-resistance CoFeB/MgO(001)/CoFeB Magnetic Tunnel Junctions for read-head applications", Appl. Phys. Lett. 87, 072503 (2005), H. Kubota et al., "Evaluation of Spin-Transfer Switching in CoFeB/MgO/CoFeB Magnetic Tunnel Junctions", Jpn. J. Appl. Phys. 44, pp. L1237-L1240 (2005).

The spin-transfer magnetization switching, however, realizes reduced memory cell size indeed, but one cell can record only one bit. Therefore, the scale of the memory can be increased only by reducing the cell size. Since the cell size reduction is restricted by the processing limit, the memory scale cannot greatly improve. Accordingly, demands have arisen for a magnetic random access memory that needs only two terminals for a memory cell for writing and reading and that realizes recording of multilevel data in one cell so as to increase the integration per unit area, and for a writing method of such a memory.

BRIEF SUMMARY OF THE INVENTION

According to an aspect of the present invention, there is provided a magnetic random access memory comprising: a first magnetic layer having a magnetization fixed along one direction; a first nonmagnetic layer stacked on the first magnetic layer and functioning as a first tunnel barrier; a second magnetic layer stacked on the first nonmagnetic layer and having a magnetization whose direction can be reversed by spin transfer through current injection; a second nonmagnetic layer stacked on the second magnetic layer and functioning as a second tunnel barrier; and a third magnetic layer stacked on the second nonmagnetic layer and having a magnetization whose direction can be reversed by spin transfer through current injection at a current density different from that of the second magnetic layer, wherein the memory includes a magnetoresistive effect element in which the first magnetic layer, the first nonmagnetic layer, and the second magnetic layer exhibit a first magnetoresistive effect, the second magnetic layer, the second nonmagnetic layer, and the third magnetic layer exhibit a second magnetoresistive effect, and the element records and reads out data of at least three levels based on a synthetic resistance obtained by the first and second magnetoresistive effects.

According to another aspect of the present invention, there is provided a magnetic random access memory comprising: a first magnetic layer having a magnetization fixed along one direction; a second magnetic layer stacked on the first magnetic layer and coupled with the first magnetic layer by exchange coupling; a nonmagnetic layer stacked on the second magnetic layer and functioning as a tunnel barrier; a third magnetic layer stacked on the nonmagnetic layer, coupled with the second magnetic layer by exchange coupling, and having a magnetization whose direction can be reversed by spin transfer through current injection; and a fourth magnetic layer stacked on the third magnetic layer, coupled with the third magnetic layer by exchange coupling, and having a magnetization whose direction can be reversed by spin transfer through current injection at a current density different from that of the third magnetic layer, wherein the memory includes a magnetoresistive effect element in which the first magnetic layer, the second magnetic layer, the nonmagnetic layer, the third magnetic layer, and the fourth magnetic layer form a magnetic tunnel junction exhibiting tunneling magnetoresistive effect, and records and reads out data of at least three levels.

According to still another aspect of the present invention, there is provided a method for performing writing to a magnetic random access memory which includes a magnetoresistive effect element having at least one magnetic tunnel junction which exhibits tunneling magnetoresistive effect, the method including supplying current to the magnetoresistive element, and recording one of four levels which correspond to a first, a second, a third, and a fourth states which correspond resistance of the magnetoresistive effect element in the ascending order, wherein the first state is made by supplying a writing current to the magnetoresistive effect element in a first direction the fourth state is made by supplying the writing current to the magnetoresistive effect element in a second direction opposite to the first direction, the second state is made by supplying the writing current to the magnetoresistive effect element in the first direction so as to make the first state, and then supplying the writing current to the magnetoresistive effect element in the second direction, and the third state is made by supplying the writing current to the magnetoresistive effect element in the second direction so as to make the fourth state, and then supplying the writing current to the magnetoresistive effect element in the first direction.

BRIEF DESCRIPTION OF THE SEVERAL VIEWS OF THE DRAWING

FIGS. 4A to 4D and 5A to 5C are sectional views of steps for explaining a method of fabricating the MRAM according to the first embodiment of the present invention;

FIGS. 6A to 6C are schematic views for explaining an MRAM according to the second embodiment of the present invention, showing the three recorded-states in a memory cell;

FIGS. 7A to 7C are graphs for schematically explaining hysteresis loops corresponding to the three recorded-states in a memory cell in the MRAM according to the second embodiment of the present invention;

FIGS. 10A to 10D are schematic views for explaining an MRAM according to the third embodiment of the present invention, showing the four recorded-states in a memory cell;

FIGS. 16A to 16C are schematic views for explaining an MRAM according to the sixth embodiment of the present invention, showing the three recorded-states in a memory cell;

FIGS. 18A to 18D are sectional views of steps, showing main portions alone, for explaining a method of fabricating an MRAM according to the eighth embodiment of the present invention.

DETAILED DESCRIPTION OF THE INVENTION

Figure 1:
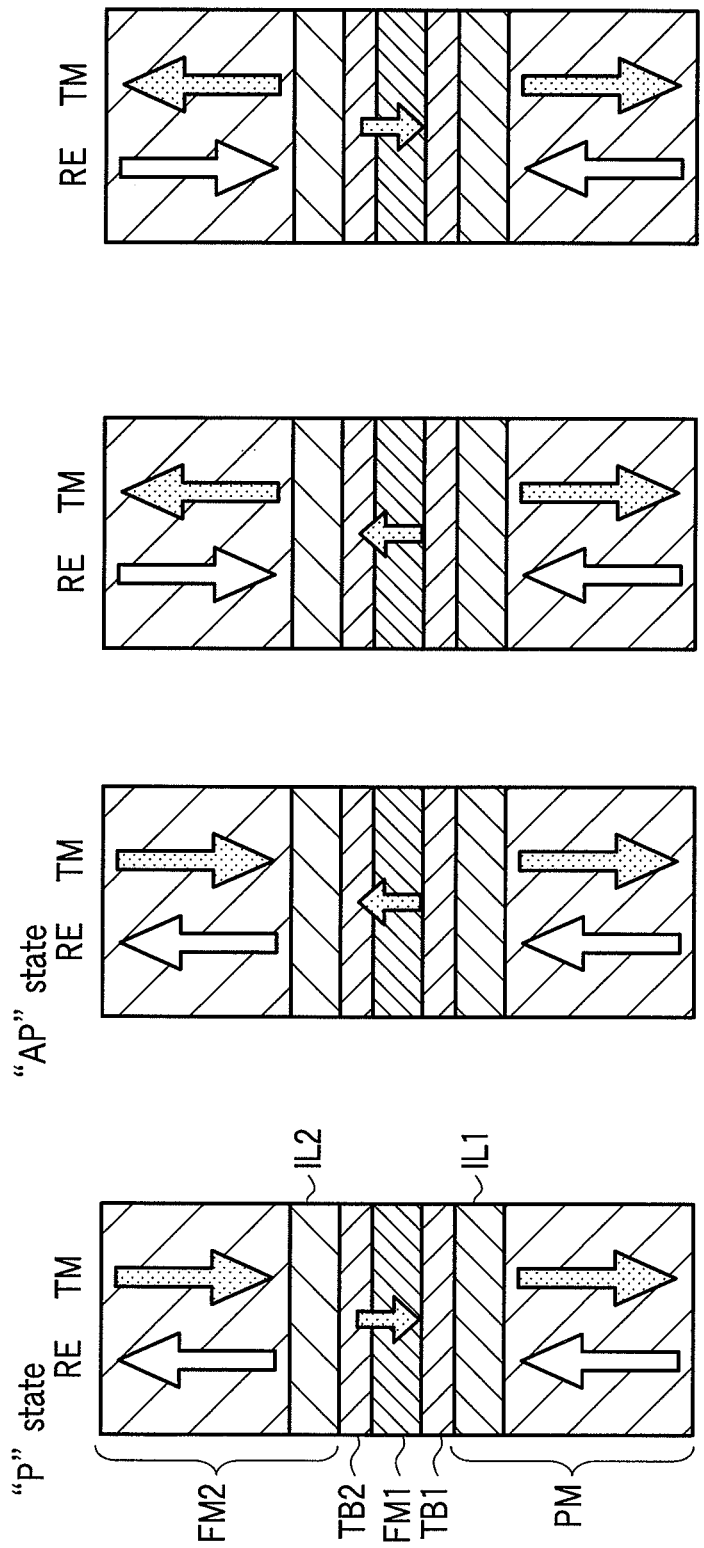
FIGS. 1A to 1D are schematic views for explaining an MRAM according to the first embodiment of the present invention, showing the four recorded-states in a memory cell.

Embodiments of the present invention will be explained below with reference to the accompanying drawing.

First Embodiment

In the first embodiment of the present invention, in order to overcome the obstacle to realize a large-scale magnetic random access memory (MRAM) only through the cell size reduction technique, formed is a magnetoresistive effect element that stores data of three or more levels in a single cell using spin-transfer-magnetization-switching and two-terminal TMR structure.

As indicated by equations 4 to 7 above, the switching current threshold for the spin transfer is determined by the damping constant $\alpha$, the saturation magnetization Ms of the free layer, and the volume (V) of the free layer, or the thickness of the free layer, and the like. Accordingly, the switching current threshold can be appropriately designed by controlling the material, stacked structure, film thickness, and the like of the TMR structure.

FIGS. 1A to 1D are schematic views for explaining an MRAM according to the first embodiment of the present invention, showing the configuration of a memory cell (MRAM cell) and the four recorded-states. This MRAM cell has a perpendicular-magnetization and the dual-junction TMR structure having dual tunnel barriers. This TMR structure generates two magnetoresistive effects, and at least data of three levels (in this embodiment, three or four levels) are recorded and read based on the change (synthetic resistance) in resistance produced in the MRAM cell by two magnetoresistive effects.

That is, the magnetoresistive effect element as an MRAM cell has a structure in which a pinned layer PM, lower tunnel barrier TB1, first free layer FM1, upper tunnel barrier TB2, and second free layer FM2 are stacked in the mentioned order. An interface layer IL1 is formed in the pinned layer PM at the lower tunnel barrier TB1 side. An interface layer IL2 is formed in the free layer FM2 at the upper tunnel barrier TB2 side.

The pinned layer PM is a first magnetic layer whose magnetization is fixed along one direction. The first free layer FM1 is a second magnetic layer whose magnetization direction can be reversed by the spin transfer through current injection. The second free layer FM2 is a third magnetic layer whose magnetization direction can be reversed by the spin transfer through current injection with a current density different from that of the second magnetic layer. The lower tunnel barrier TB1 and upper tunnel barrier TB2 are respectively first and second nonmagnetic layers.

The pinned layer PM and free layer FM2 are made of a ferrimagnetic material containing a transition metal (TM) and rare-earth metal (RE). The free layer FM1 is made of a transition metal alone. Inside the pinned layer PM and free layer FM2, the transition metal and rare-earth metal are perpendicularly magnetized while holding exchange coupling therebetween.

The multilevel recorded states will now be explained in detail. This MRAM cell exhibits two magnetoresistive effects, and data of four levels are recorded and read out based on the synthetic resistance from these magnetoresistive effects. First, second, third, and fourth states correspond to the four levels in ascending order of the resistance of the magnetoresistive effect element serving as a memory cell. If the resistances of the second and third states are equal, the memory cell stores data of three levels.

In the first state shown in FIG. 1A, the transition metals in both the free layers FM1 and FM2 are magnetized parallel to that of the pinned layer PM, and therefore both the lower and upper tunnel barriers TB1 and TB2 are in the low-resistance state.

FIG. 1B shows the fourth state in which only the magnetization direction of the free layer FM1 is reversed from the first state. The fourth state exhibits the highest resistance because both the tunnel barriers TB1 and TB2 are in magnetization-antiparallel state.

FIG. 1C shows the third state (or the second state) in which both the magnetization directions of the free layers FM1 and FM2 are reversed from the first state. Therefore, only the lower tunnel barrier TB1 is in the magnetization-antiparallel state and exhibits a resistance intermediate between the first and second states.

The second state (or the third state) shown in FIG. 1D is a state in which only the magnetization direction of the free layer FM2 is reversed from the first state. Consequently, only the upper tunnel barrier TB2 is in the magnetization-antiparallel state and exhibits a resistance intermediate between the first and second states as in the third state.

Accordingly, it is possible to record three-level data if the second and third states have the same resistance, and four-level data if they have different resistances.

In order to record four-levels data, the upper and lower tunnel barriers TB2 and TB1 need to be different from each other in MR ratio. Alternatively, one of the two magnetoresistive structures can be a giant magnetoresistive (GMR) structure instead of TMR structure to form a TMR and GMR structure hybrid memory cell.

In order to achieve multilevel writing, switching current thresholds Jc of the free layers FM1 and FM2 need to be different. This can be achieved by designing their magnetic characteristics through modification of the material thickness, material selection, and exchange coupling state and the like. The sequence and hysteresis loop for actual writing vary in accordance with which of the switching current thresholds Jc of the free layers FM1 and FM2 is larger.

Figure 2:
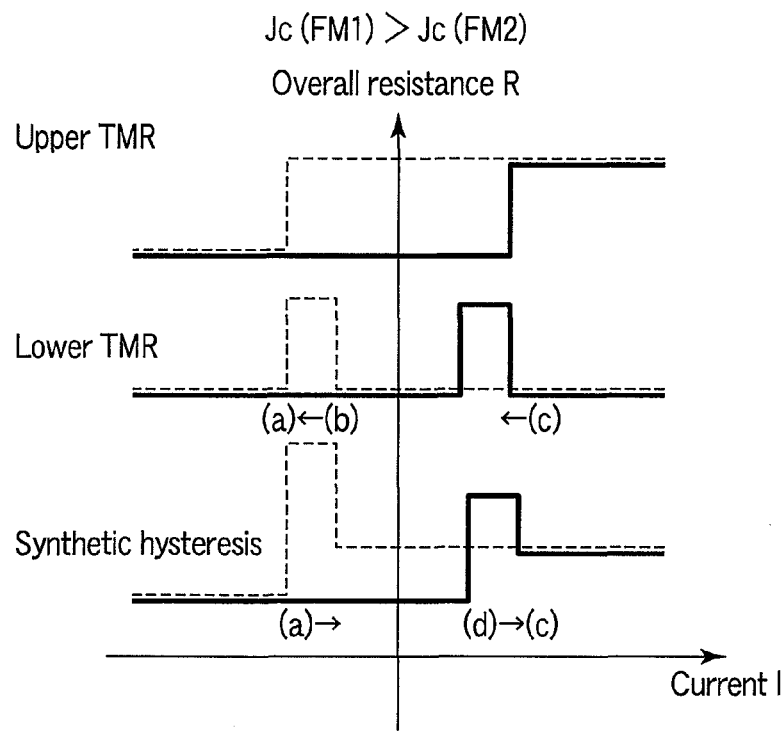
FIG. 2 is a graph for explaining a first writing operation principle for multilevel recording in the MRAM according to the first embodiment of the present invention.
Figure 3:
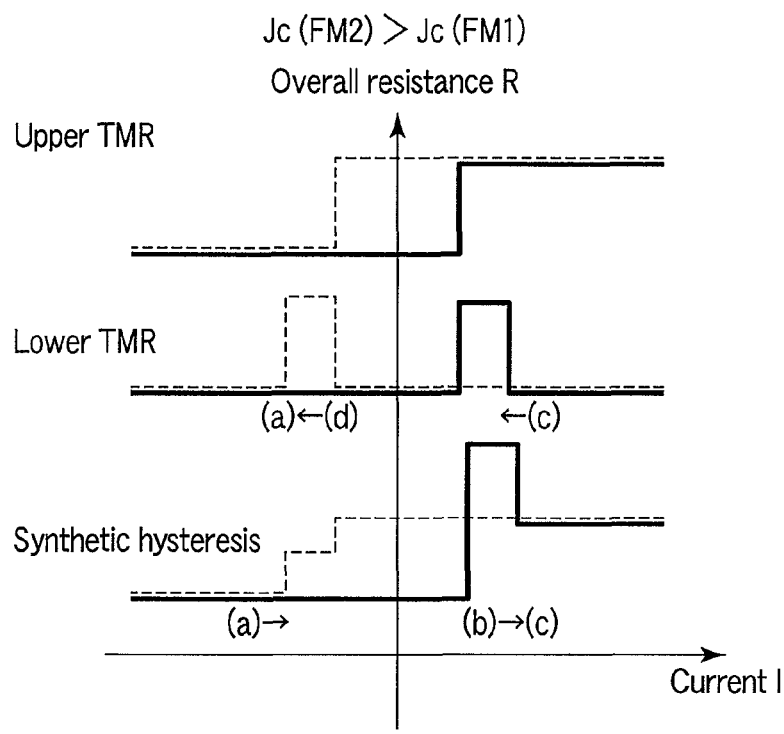
FIG. 3 is a graph for explaining a second writing operation principle for multilevel recording in the MRAM according to the first embodiment of the present invention.

FIGS. 2 and 3 illustrate actual writing sequences. FIGS. 2 and 3 each illustrates the upper TMR, lower TMR, and synthetic hysteresis with the abscissa used to represent the current I, and the ordinate used to represent the overall resistance R on the ordinate.

FIG. 2 shows the writing sequence when Jc (FM1)>Jc (FM2), i.e., when the switching current threshold Jc of the free layer FM1 is larger than the free layer FM2. FIG. 3 shows the writing sequence when Jc (FM2)>Jc (FM1), i.e., when the switching current threshold Jc of the free layer FM2 is larger than the free layer FM1.

It should be noted that the hysteresis loops are complicate because the AP state does not exhibit the highest resistance. Also, since each intermediate value can be reached by either only sweeping the current from the P state or only sweeping it from the AP state, the sequence varies in accordance with data of a level to be written.

With Jc (FM1)>Jc (FM2) as shown in FIG. 2, when the current in the AP writing direction is increased from the P state, the resistance takes the intermediate value 1 in the state (d), and then the intermediate value 2 in the state (c), followed by the settlement of the whole system in the AP state. On the contrary, when the current in the P writing direction is gradually increased from the AP state, the resistance becomes highest in the state (b), and then the whole system transits into the P state, i.e., the lowest-resistance state in the state (a).

With Jc (FM2)>Jc (FM1), when the current in the AP writing direction is increased from the P state, the resistance becomes highest in the state (b), and then takes the intermediate value 1 in the state (c), followed by the settlement of the whole system in the AP state. On the contrary, when the current in the P writing direction is gradually increased from the AP state, the resistance takes the intermediate value 2 in the state (d), and then the whole system transits into the P state, i.e., the lowest-resistance state with the state (a).

The reading operation principle of the present embodiment will now be explained. The MRAM cell (MTJ cell) has different resistances in the first to fourth states as described above. Assuming these resistances to be, for example, R0 to R3, then they are represented by $R0 = Rp\_top + Rp\_btm$ $R2 = Rap\_top + Rp\_btm$ $R3 = Rp\_top + Rap\_btm$ $R1 = Rap\_top + Rap\_btm$ In addition, the following relations hold.

$$MR\_top = (Rap\_top - Rp\_top)/Rp\_top$$

$$MR\_btm = (Rap\_btm - Rp\_btm)/Rp\_btm$$

Since MR_top and MR_btm have positive finite values, R0 to R3 are different resistances if the following relation holds.

$$Rap\_top + Rp\_btm \neq Rp\_top + Rap\_btm$$

This can be achieved when magnetic resistances MR for the top and bottom of the MTJ cell are different from each other, or when the magnetization-parallel-state tunnel resistances Rp for these two are different from each other.

The manufacturing process of the MRAM cell according to the first embodiment will be explained below with reference to FIGS. 4A to 4D and 5A to 5C.

First, as shown in FIG. 4A, after processes for manufacturing switching devices and multilayered interconnects and the like, stacked films for a dual-junction TMR structure 12A are formed on a planarized interlayer insulation film (silicon oxide film) 11 as an underlying layer.

The TMR structure 12A is obtained by forming, in the order named, Ta, Ru, or TiN stacked film of about, e.g., 50 nm thick forming a lower electrode 13, a pinned layer (PM) 14, a transition metal layer as a first interface layer (IL1) 15, a metal oxide film of about 1 nm thick made of MgO or the like serving as a lower tunnel barrier (TB1) 16, a ferromagnetic layer of about 1 to 4 nm thick forming a first free layer (FM1) 17, an upper tunnel barrier (TB2) 18, a transition metal layer as a second interface layer (IL2) 19, a ferromagnetic layer forming a second free layer (FM2) 20, and a Ta or Ru film or stacked films thereof serving as a cap layer 21 and also upper contact layer. Further, a conductive hard mask layer 22 made of Ta or the like is formed on the cap layer 21.

After these stacked films are formed, annealing is performed in the vacuum at a temperature of about 360° C. for about 2 hours while a magnetic field of, e.g., 1 to 2 T is applied in a direction which gives the desired uniaxial anisotropy, thereby giving the first and second free layers 17 and 20 anisotropic magnetization.

Then, the hard mask layer 22 is coated with a photoresist. As shown in FIG. 4B, the resist pattern 23 having the planar shape of an MTJ element is formed by a well-known photolithography technique, and the hard mask layer 22 is etched by the RIE with the resist pattern 23 used as a mask.

After that, the residual resist and etching residue are removed by ashing, and the cap layer 21, second free layer 20, second interface layer 19, upper tunnel barrier 18, and first free layer 17 are etched by the ion milling with the hard mask layer 22 used as a mask and the lower tunnel barrier 16 as the stopper layer (FIG. 4C).

Subsequently, a protective film 24 such as a silicon nitride film is formed on the entire surface and is etched back until the top of the hard mask layer 22 is exposed so as to remain on the side of the MTJ element, thereby protecting the free layers 17 and 20 as ferromagnetic layers (FIG. 4D).

Figure 5A:
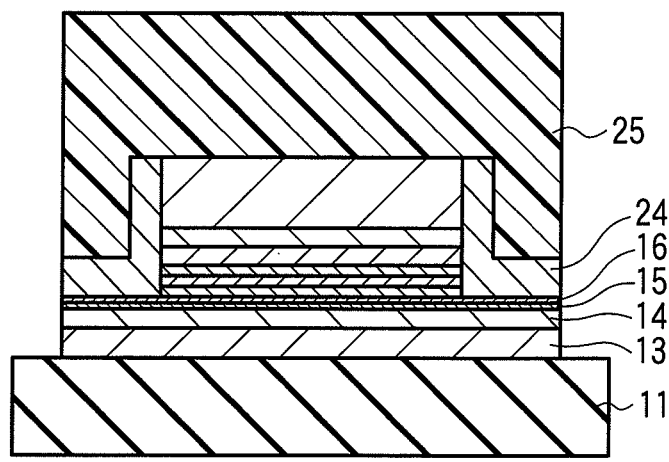

As shown in FIG. 5A, a resist pattern 25 corresponding to the planar shape of the lower electrode 13 is formed by a well-known photolithography technique. The resist pattern 25 is used as a mask to etch the protective film 24, lower tunnel barrier 16, first interface layer 15, pinned layer 14, and lower electrode 13 in this order by the ion milling or RIE.

Figure 5B:
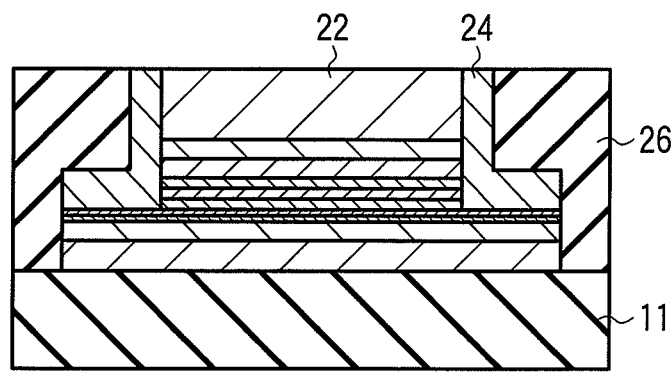

After the removal of remaining photoresist by, e.g., ashing in an oxygen plasma, an interlayer insulation film 26 made of an insulator such as $SiO_x$ is deposited on the entire surface and planarized by CMP or the like, thereby exposing the top of the conductive hard mask 22 (FIG. 5B).

Figure 5C:
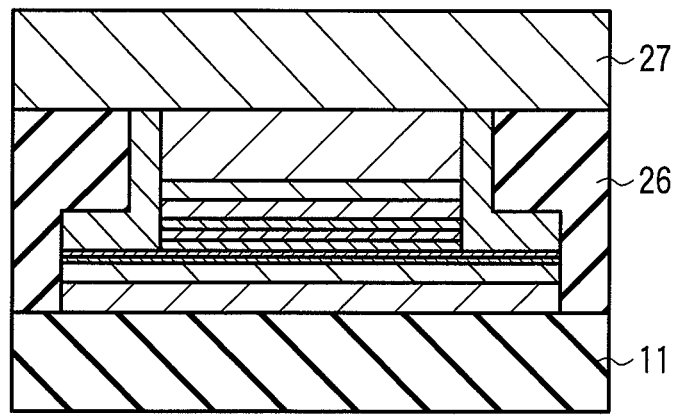

Finally, as shown in FIG. 5C, material for interconnects such as AlCu, which is normally used in LSIs, is formed on the entire surface by the sputtering and patterned by the lithography and etching, thereby forming a bit line 27, which results in the completed MTJ element (memory cell).

In the first embodiment of the present invention as described above, a magnetoresistive effect element that stores data of three or four levels can be formed by using the two-terminal TMR structure for the spin-transfer-magnetization-reversal. This can increase the integration per unit area.

Second Embodiment

FIGS. 6A to 6C schematically show an MRAM cell according to the second embodiment of the present invention. FIGS. 7A to 7C schematically show the hysteresis loops for the MRAM cell.

In the MRAM cell according to the second embodiment, one magnetic tunnel junction (a single magnetic tunnel junction) is used to provide the TMR effect. A pinned layer PM and free layer FM are each made of a ferrimagnetic material containing a rare-earth metal (RE) and transition metal (TM). Transition metal layers (interface layers) IL1 and IL2 are respectively formed in the pinned layer PM and free layer FM near a tunnel barrier TB. The tunnel barrier TB is sandwiched between the transition metal layers IL1 and IL2. The exchange coupling between the pinned layer PM and free layer FM makes the perpendicularly-magnetized parallel and antiparallel states of the TMR effect.

In the second embodiment, the exchange coupling between the transition metal layer IL2 and ferrimagnetic layer of the free layer FM is weakened, so that controlled spin injection current can make the state in which the magnetization of the transition metal layer IL2 of the free layer FM is directed along the in-plane direction (or, lies) instead of directed perpendicularly as shown in FIG. 6B, thereby generating total three recorded-states.

Since the MRAM cell according to the second embodiment is formed with the single magnetic tunnel junction, steps for fabricating thereof are slightly different from the first embodiment described above.

The manufacturing process of the above-mentioned MRAM cell will be explained below with reference to FIGS. 8A to 8D and 9A to 9C.

Figure 8A:
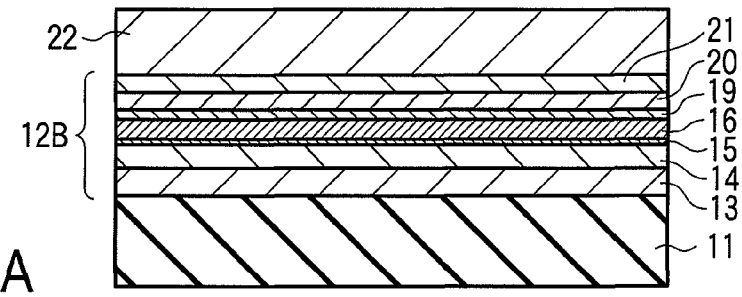
FIGS. 8A to 8D and 9A to 9C are sectional views of steps for explaining a method of fabricating the MRAM according to the second embodiment of the present invention.

As shown in FIG. 8A, after processes for manufacturing switching devices and multilayered interconnects and the like, stacked films for a TMR structure 12B are formed on a planarized interlayer insulation film (silicon oxide film) 11 as an underlying layer.

The TMR structure 12B is obtained by forming, in the order named, Ta, Ru, or TiN stacked film of about, e.g., 50 nm thick forming a lower electrode 13, a pinned layer (PM) 14, a transition metal layer as a first interface layer (IL1) 15, a metal oxide film of about 1 nm thick made of MgO or the like serving as a lower tunnel barrier (TB) 16, a transition metal layer as a second interface layer (IL2) 19, a ferromagnetic layer of about 1 to 4 nm thick forming a free layer (FM) 20, and a Ta or Ru film or stacked films thereof serving as a cap layer 21 and also upper contact layer. Further, a conductive hard mask layer 22 made of Ta or the like is formed on the cap layer 21.

After these stacked films are formed, annealing is performed in the vacuum at a temperature of about 360° C. for about 2 hours while a magnetic field of, e.g., 1 to 2 T is applied in a direction which gives the desired uniaxial anisotropy, thereby giving the first and second free layer 20 anisotropic magnetization.

Figure 8B:
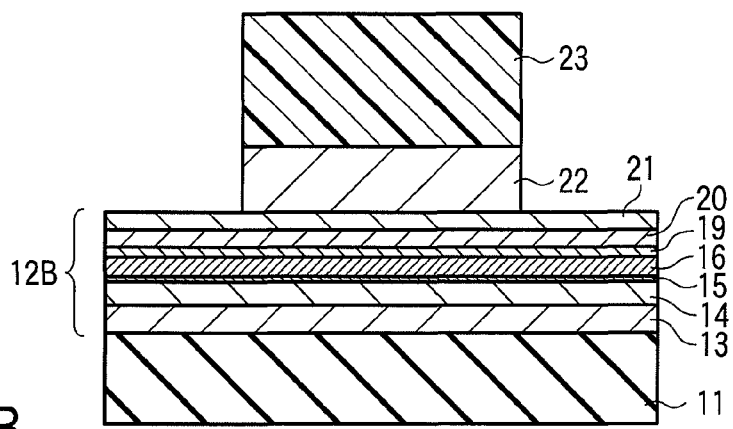

Then, the hard mask layer 22 is coated with a photoresist. As shown in FIG. 8B, the resist pattern 23 having the planar shape of an MTJ element is formed by a well-known photolithography technique, and the hard mask layer 22 is etched by the RIE with the resist pattern 23 used as a mask.

Figure 8C:
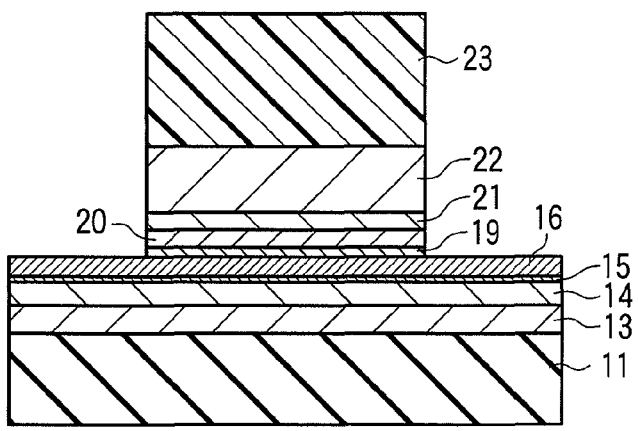

After that, the residual resist and etching residue are removed by ashing, and the cap layer 21, free layer 20, and second interface layer 19 are etched by the ion milling with the hard mask layer 22 used as a mask and the tunnel barrier 16 as the stopper layer (FIG. 8C).

Figure 8D:
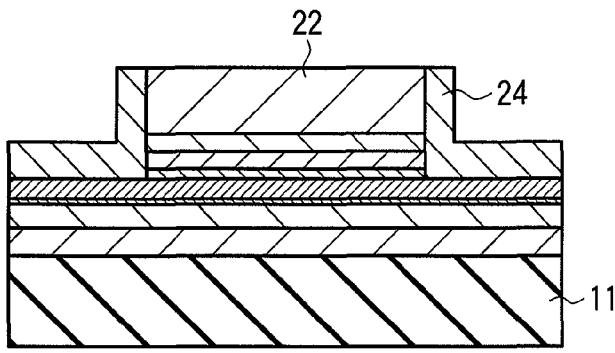

Subsequently, a protective film 24 such as a silicon nitride film is formed on the entire surface and is etched back until the top of the hard mask layer 22 is exposed so as to remain on the side of the MTJ element, thereby protecting the free layer 20 as ferromagnetic layers (FIG. 8D).

Figure 9A:
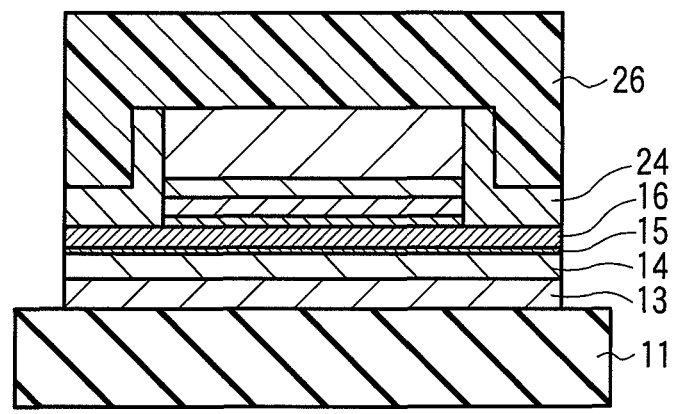

As shown in FIG. 9A, a resist pattern 23 corresponding to the planar shape of the lower electrode 13 is formed by a well-known photolithography technique. The resist pattern 25 is used as a mask to etch the protective film 24, lower tunnel barrier 16, first interface layer 15, pinned layer 14, and lower electrode 13 in this order by the ion milling or RIE.

Figure 9B:
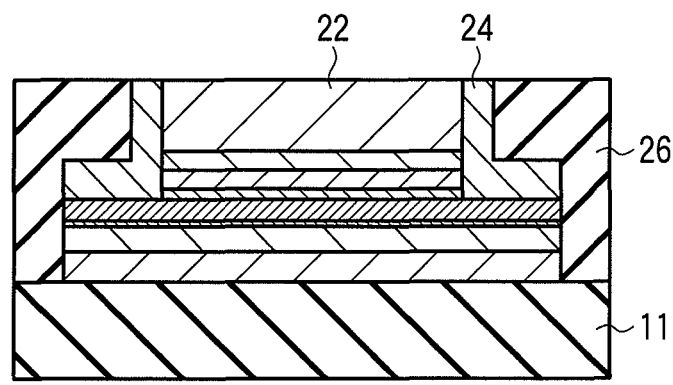

After the removal of remaining photoresist by, e.g., ashing in an oxygen plasma, an interlayer insulation film 26 made of an insulator such as $SiO_x$ is deposited on the entire surface and planarized by CMP or the like, thereby exposing the top of the conductive hard mask 22 (FIG. 9B).

Figure 9C:
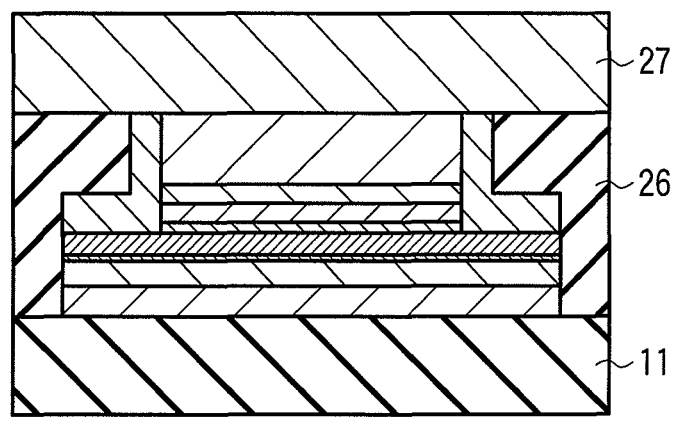
Figure 11D:
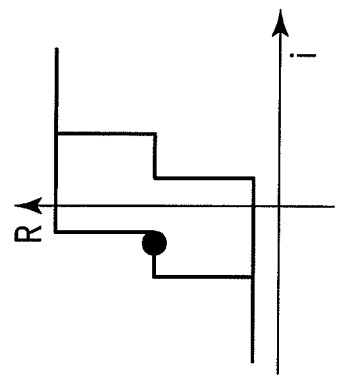
FIGS. 11A to 11D are graphs for schematically explaining hysteresis loops corresponding to the four recorded-states in a memory cell in the MRAM according to the third embodiment of the present invention.
Figure 11C:
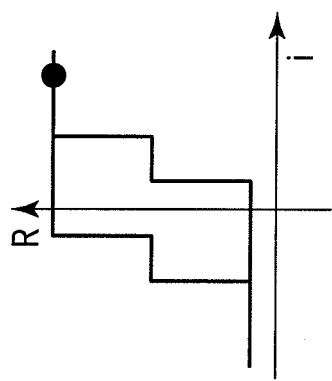
Figure 11B:
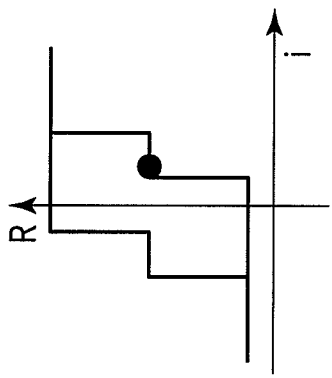
Figure 11A:
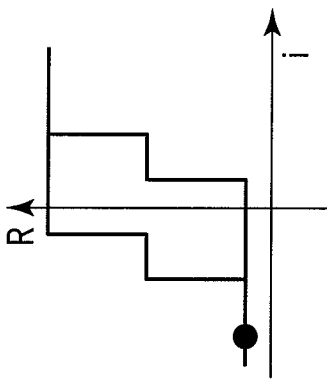
Figures 12A, 12B, 12C, 12D:
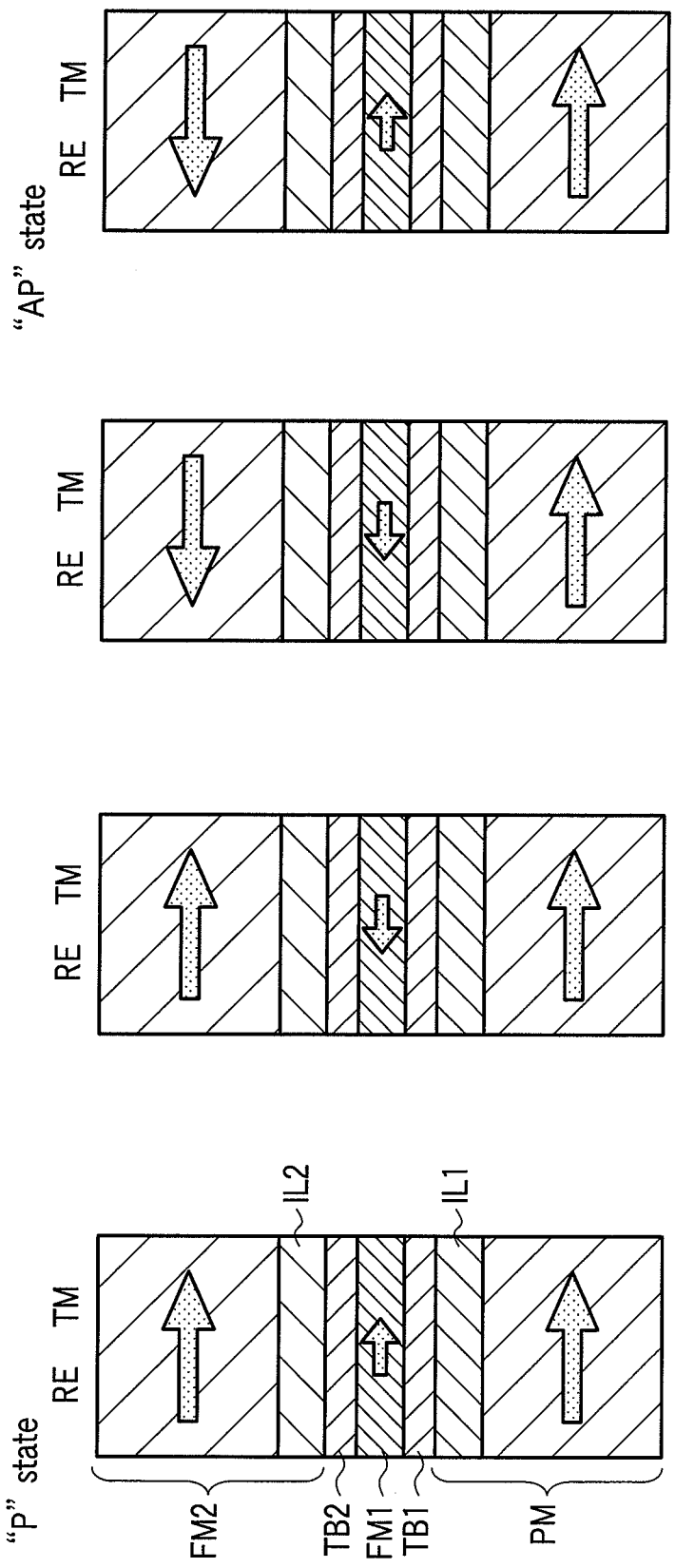
FIGS. 12A to 12D are schematic views for explaining an MRAM according to the fourth embodiment of the present invention, showing the four recorded-states in a memory cell.

Finally, as shown in FIG. 9C, material for an interconnect such as AlCu, which is normally used in LSIs, is formed on the entire surface by sputtering and patterned by the lithography and etching, thereby forming a bit line 27, which results in the completed MTJ element.

In the second embodiment of the present invention as described above, one magnetic tunnel junction is used to present the TMR effect, and controlled spin injection current can make the state in which the magnetization of the transition metal layer of the free layer lies along the in-plane direction instead of the perpendicular direction, so that three recorded-states can be provided. This can increase the integration per unit area.

Third Embodiment

FIGS. 10A to 10D schematically show an MRAM cell according to the third embodiment of the present invention. FIGS. 11A to 11D schematically show the hysteresis loops of the MRAM cell.

In the MRAM cell according to the third embodiment of the present invention, one magnetic tunnel junction is used to present the TMR effect as in the second embodiment. A pinned layer PM and free layer FM are each made of a ferrimagnetic material containing a rare-earth metal (RE) and transition metal (TM). Transition metal layers (interface layers) IL1 and IL2 are respectively formed in the pinned layer PM and free layer FM near a tunnel barrier TB. The tunnel barrier TB is sandwiched between the transition metal layers IL1 and IL2. The exchange coupling between the pinned layer PM and free layer FM produces perpendicularly-magnetized parallel and antiparallel states of the TMR effect.

The exchange coupling between the transition metal layer IL2 and the ferrimagnetic layer of the free layer FM are weakened, the transition metal layer IL2 is made of a material that tends to be directed along a non-perpendicular direction (e.g., a material that tends to be directed along (111) as opposed to the ferrimagnetic layer that tends to be directed along (001)), and the magnetization directions in the ferrimagnetic layer and transition metal layer IL2 in the free layer FM are independently controlled, so that more than one (three or four) recorded-states are obtained.

In the third embodiment of the present invention, one magnetic tunnel junction is used to present the TMR effect as in the second embodiment, and independently controlling the magnetization directions in the ferrimagnetic layer and transition metal layer IL2 in the free layer FM can produce more than one (three or four) recorded-states. This can increase the integration per unit area.

Fourth Embodiment

Figure 13:
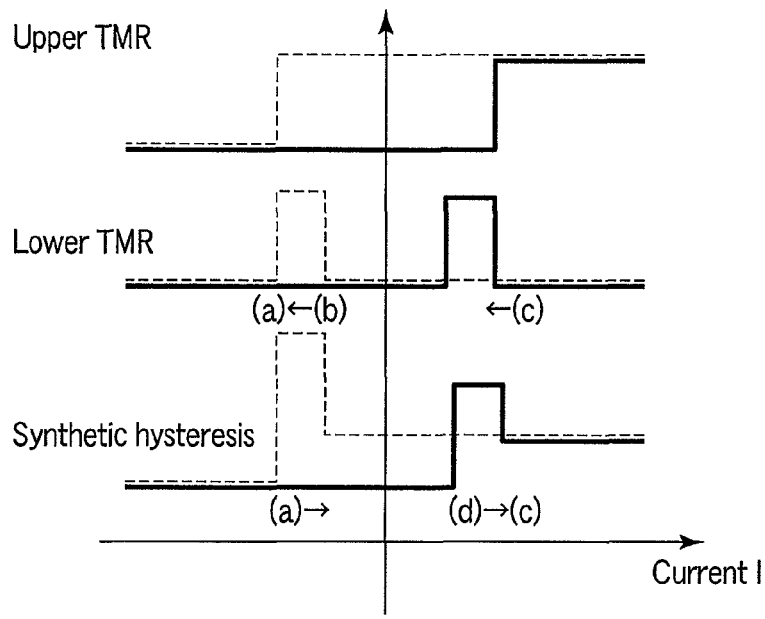
FIG. 13 is a graph for explaining a first writing operation principle for multilevel recording in the MRAM according to the fourth embodiment of the present invention.
Figure 14:
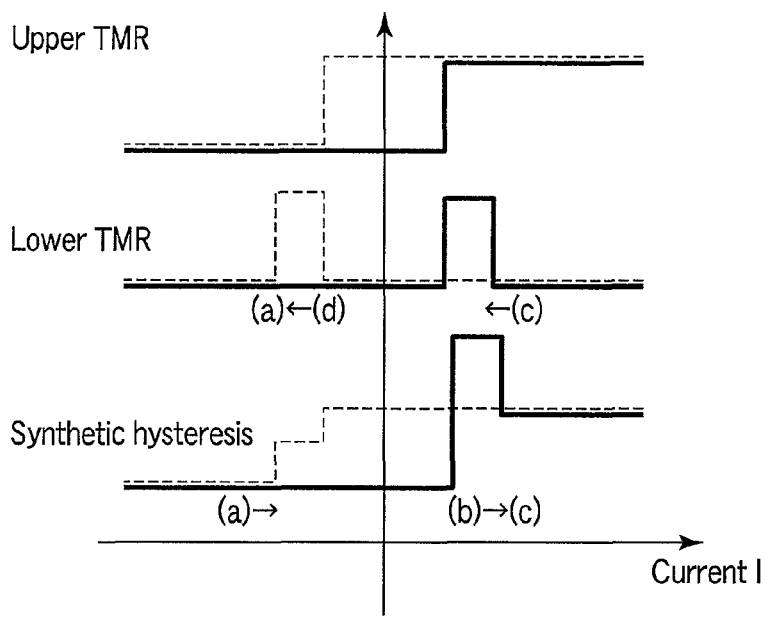
FIG. 14 is a graph for explaining a second writing operation principle for multilevel recording in the MRAM according to the fourth embodiment of the present invention.
Figure 15D:
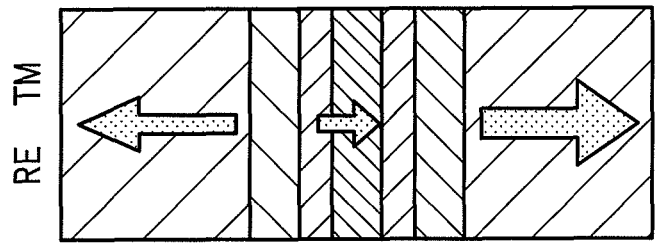
FIGS. 15A to 15D are schematic views for explaining an MRAM according to the fifth embodiment of the present invention, showing the four recorded-states in a memory cell.
Figure 15C:
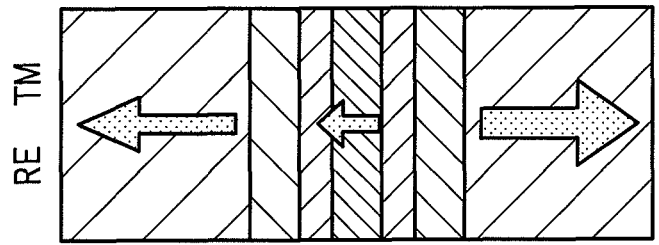
Figure 15B:
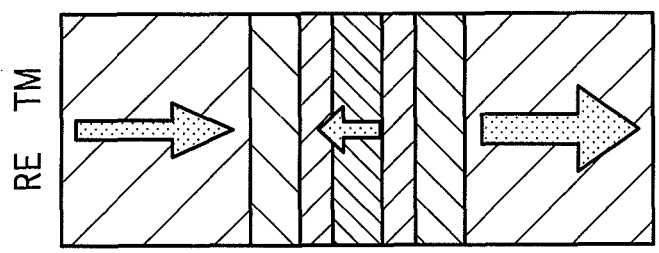
Figure 15A:
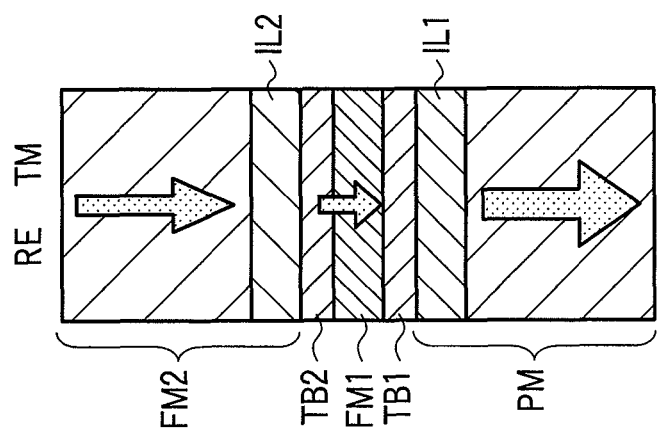
Figure 17A:
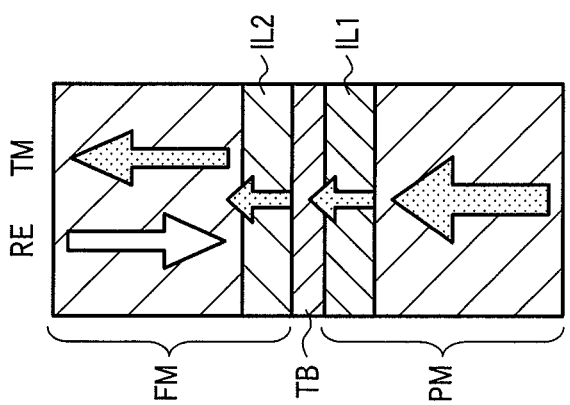
FIGS. 17A to 17D are schematic views for explaining an MRAM according to the seventh embodiment of the present invention, showing the four recorded-states in a memory cell.
Figure 17B:
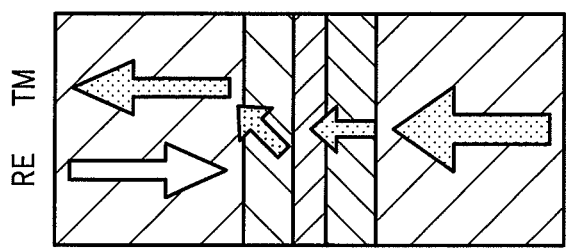
Figure 17C:
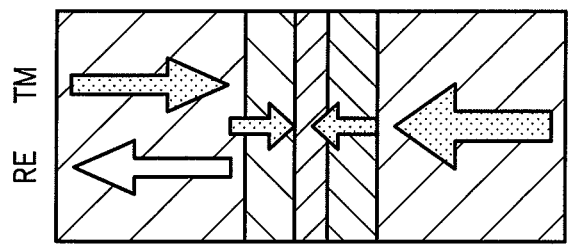
Figure 17D:
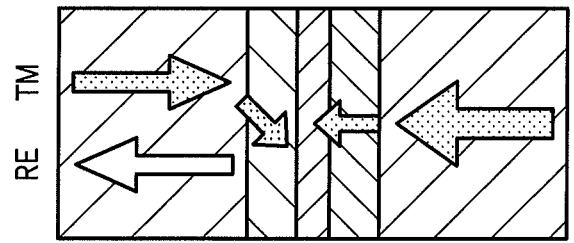

FIGS. 12A to 12D schematically show an MRAM cell according to the fourth embodiment of the present invention. FIGS. 13 and 14 illustrate the writing sequences.

The MRAM cell according to the fourth embodiment of the present invention has an in-plane-magnetization TMR structure having dual tunnel barriers (dual magnetic tunnel junctions). A pinned layer PM, first free layer FM1, and second free layer FM2 are each made of a ferromagnetic material of a transition metal. The basic operations of writing and reading are the same as the first embodiment. That is, as shown in FIGS. 13 and 14, different hysteresis loops are formed in accordance with the difference between switching current thresholds Jc of the free layers FM1 and FM2. FIG. 13 shows a case in which Jc (FM1)>Jc (FM2), and FIG. 14 shows a case in which Jc (FM2)>Jc (FM1).

The MRAM cell according to the fourth embodiment of the present invention is basically the same as the first embodiment except for the magnetization directions. Therefore, a repetitive explanation will be omitted.

In the fourth embodiment of the present invention, an in-plane-magnetization TMR structure having dual tunnel barriers can be formed, and using the difference between the two free layers FM1 and FM2 in the switching current thresholds Jc to present different hysteresis loops, so that more than one (three or four) recorded-states can be produced. This can increase the integration per unit area.

Fifth Embodiment

As shown in FIGS. 15A to 15D, an MRAM cell according to the fifth embodiment of the present invention has a perpendicular-magnetization TMR structure having dual tunnel barriers. A pinned layer PM is formed by an L10 perpendicular-magnetization film. Exchange coupling acts between the pinned layer PM and a first free layer FM1, and between the first free layer FM1 and a second free layer FM2.

Writing sequences of the fifth embodiment are the same as the first embodiment as shown in FIGS. 2 and 3.

In the fifth embodiment of the present invention, a perpendicular-magnetization TMR structure having dual tunnel barriers can be formed, and the integration per unit area can be increased by operating one element which stores data or three or four levels.

Sixth Embodiment

In an MRAM cell according to the sixth embodiment of the present invention as shown in FIGS. 16A to 16C, one magnetic tunnel junction is used to present the TMR effect. A pinned layer PM is formed by an L10 perpendicular-magnetization film. A free layer FM is made of a ferrimagnetic material containing a rare-earth metal (RE) and transition metal (TM). Transition metal layers (interface layers) IL1 and IL2 are respectively formed in the pinned layer PM and free layer FM near a tunnel barrier. The exchange coupling between the pinned layer PM and free layer FM makes perpendicularly-magnetized parallel and antiparallel states of the TMR effect.

In this embodiment as shown in FIGS. 16A to 16C, the exchange coupling between the transition metal layer and ferrimagnetic layer of the free layer FM is weakened, so that controlled spin injection current can make the state in which the magnetization of the transition metal layer of the free layer FM lies along the in-plane direction instead of directed perpendicularly, thereby generating total three recorded-states.

Writing sequences of the sixth embodiment are the same as the second embodiment as shown in FIGS. 7A to 7C.

In the sixth embodiment of the present invention, only one magnetic tunnel junction can exhibit the TMR effect, and controlled spin injection current can make the state in which the magnetization of the transition metal layer of the free layer lies along the in-plane direction instead of the perpendicular direction, so that three recorded-states can be provided. This can increase the integration per unit area.

Seventh Embodiment

In an MRAM cell according to the seventh embodiment of the present invention as shown in FIGS. 17A to 17D, one magnetic tunnel junction is used to present the TMR effect as in the sixth embodiment. A pinned layer PM is formed by an L10 perpendicular-magnetization film. A free layer FM is made of a ferrimagnetic material containing a rare-earth metal (RE) and transition metal (TM). Transition metal layers (interface layers) IL1 and IL2 are respectively formed in the pinned layer PM and free layer FM near a tunnel barrier. The exchange coupling between the pinned layer PM and free layer FM makes perpendicularly-magnetized parallel and antiparallel states of the TMR effect.

The exchange coupling between the transition metal layer and the ferrimagnetic layer of the free layer FM are weakened, the transition metal layer is made of a material that tends to be directed along a non-perpendicular direction (e.g., a material that tends to be directed along (111) as opposed to the ferrimagnetic layer that tends to be directed along (001)), and the magnetization directions in the ferrimagnetic layer and transition metal layer IL2 in the free layer FM are independently controlled, so that more than one (three or four) recorded-states are obtained.

In the seventh embodiment of the present invention, one magnetic tunnel junction is used to present the TMR effect, and independently controlling the magnetization directions in the ferrimagnetic layer and transition metal layer IL2 in the free layer FM can produce more than one (three or four) recorded-states. This can increase the integration per unit area.

Eighth Embodiment

FIGS. 18A to 18D schematically show the fabrication steps of an MRAM according to the eighth embodiment of the present invention. In this embodiment, an MTJ element having different MR ratios in an upper tunnel barrier TB2 and lower tunnel barrier TB1 is formed by the self-alignment. Fabrication steps of the MTJ element will be explained below.

As shown in FIG. 18A, a lower electrode 13, pinned layer (including an interface layer) 14, lower tunnel barrier 16, first free layer 17, upper tunnel barrier 18, second free layer (including an interface layer) 20, and cap layer 21 are stacked in the same manner as in the first embodiment.

The cap layer (that also functions as an upper contact layer) 21 and second free layer 20 are partially etched away with the upper tunnel barrier 18 used as an etching stopper layer, resulting in a structure as shown in FIG. 18B.

After that, a silicon nitride film is deposited on the entire surface by sputtering or CVD, and etched back by the RIE or ion milling. As a result, as shown in FIG. 18C, sidewalls 28 are formed to cover the side surfaces of the exposed cap layer 21 and free layer 20.

Then, the ion milling is used again to etch the upper tunnel barrier 18 and first free layer 17 with the lower tunnel barrier layer 16 used as a stopper layer (FIG. 18D).

After that, a silicon nitride film is deposited on the entire surface by sputtering or CVD, thereby protecting the side surfaces of the MTJ element. Then, a dielectric material such as $SiO_x$ is deposited on the entire surface and planarized by CMP or the like. Finally, a material for interconnects such as AlCu, which is normally used in LSIs, is formed on the entire surface by sputtering and patterned by the lithography and etching, thereby forming a bit line, which results in the completed MTJ cell.

With this fabrication method, for a part of the element including the free layer 20 and free layer 17, the free layer 20 is smaller than the free layer 17 in the width by twice the thickness of the sidewall 28. Accordingly, different switching current thresholds Jc can be achieved by the self-alignment through the volume difference between the free layers 17 and 20.

The fabrication method according to the eighth embodiment is also applicable to the fourth embodiment, which uses dual magnetic tunnel junctions.

Ninth Embodiment

Figure 19C:
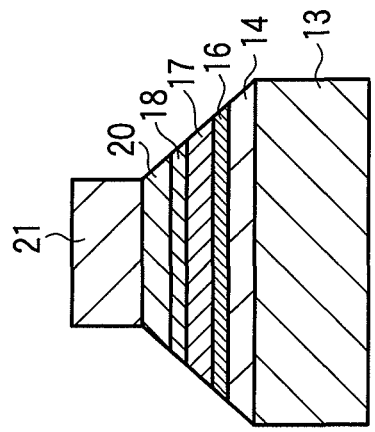
FIGS. 19A to 19C are sectional views of steps, showing main portions alone, for explaining a method of fabricating an MRAM according to the ninth embodiment of the present invention.
Figure 19B:
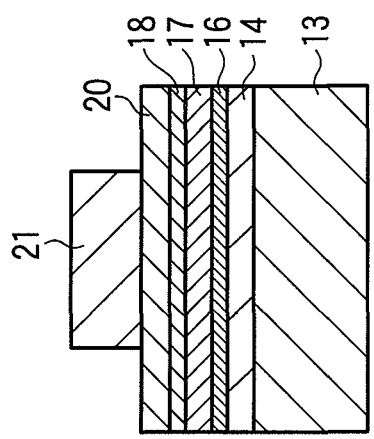
Figure 19A:
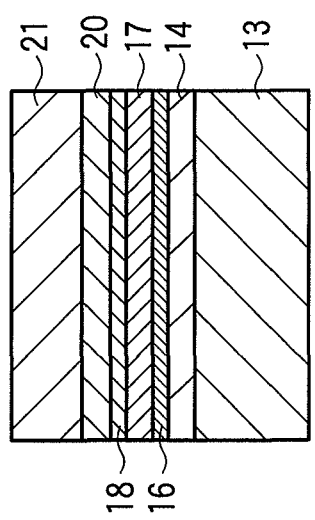

FIGS. 19A to 19C schematically shows the fabrication steps of an MRAM according to the ninth embodiment of the present invention. As in the eighth embodiment, an MTJ element having different MR ratios in an upper tunnel barrier TB2 and lower tunnel barrier TB1 is formed by the self-alignment. Fabrication steps of the MTJ element will be explained below.

This embodiment is basically the same as the eighth embodiment except that when processing the stacked structure of the MTJ element by the ion milling, a substrate is irradiated, while rotated, with the beam having the incident angle of about, e.g., 45°, thereby tapering the structure by more than 45° so as to realize different widths between the free layers 17 and 20 by the self-alignment. Accordingly, different switching current thresholds Jc can be achieved by the self-alignment through the volume difference between the free layers 17 and 20, as in the eighth embodiment.

Similar to the eighth embodiment, the fabrication method according to the ninth embodiment is also applicable to the fourth embodiment, which uses dual magnetic tunnel junctions.

(Material Systems)

Various materials for forming the MRAM cells (MTJ elements) according to the above-mentioned embodiments will now be explained in detail.

(In-Plane-magnetization Magnetic Tunnel Junction)

An MTJ element having single magnetic tunnel junction structure or dual magnetic tunnel junction structure with the in-plane-magnetization can be formed using the following materials.

Favorable examples of the materials of the pinned layer (also called magnetization pinned layer) PM and the free layers (also called magnetic free layers) FM, FM1, and FM2 are Fe, Co, Ni, and their alloys, magnetite having a high spin polarization ratio, oxides such as $CrO_2$ and $RXMnO_{3-y}$ (R being rare-earth element, X being Ca, Ba, and Sr), and Heusler alloys such as NiMnSb and PtMnSb. These magnetic materials can more or less contain nonmagnetic elements such as Ag, Cu, Au, Al, Mg, Si, Bi, Ta, B, C, O, N, Pd, Pt, Zr, Ir, W, Mo, and Nb, provided that the materials do not lose ferromagnetism.

As the material for the antiferromagnetic layer forming a part of the pinned layer PM, it is preferable to use, e.g., Fe—Mn, Pt—Mn, Pt—Cr—Mn, Ni—Mn, Ir—Mn, NiO, or $Fe_2O_3$.

As the material for the MTJ, it is desirable to use, for the spin transfer use, a tunnel barrier formed by annealed magnesium oxide (MgO) or stack of magnesium (Mg) and magnesium oxide (MgO), which exhibits coherent tunneling effect. It is also possible to use various dielectrics such as $Al_2O_3$, $SiO_2$, AlN, $Bi_2O_3$, $MgF_2$, $CaF_2$, $SrTiO_2$, and $AlLaO_3$. These dielectrics may contain oxygen, nitrogen, and fluorine deficiencies.

(Perpendicular-Magnetization Magnetic Tunnel Junction)

An MTJ element having a magnetic tunnel junction with the perpendicular-magnetization is the same as that having magnetic tunnel junction with the in-plane-magnetization.
<A>A magnetic material having a high coercivity is made of a material having a high magnetic anisotropic energy density of $1 \times 10^6$ erg/cc or more.

Examples of the material will now be explained.

Example A1

A material made of an alloy containing at least one of Fe (iron), Co (cobalt), and Ni (nickel) and at least one of Cr (chromium), Pt (platinum), and Pd (palladium).

Examples of an ordered alloy are Fe(50)Pt(50), Fe(50)Pd (50), and Co(50)Pt(50). Examples of a random alloy are a CoCr alloy, CoPt alloy, CoCrPt alloy, CoCrPtTa alloy, and CoCrNb alloy.

Example A2

A structure in which at least one of Fe, Co, and Ni or an alloy containing one of these elements and one of Pd and Pt or an alloy containing one of these elements are alternately stacked.

Examples are a Co/Pt artificial lattice, Co/Pd artificial lattice, and CoCr/Pt artificial lattice. Using the Co/Pt artificial lattice or Co/Pd artificial lattice can realize a high resistance change ratio (MR ratio) of about 40%.

Example A3

An amorphous alloy containing at least one rare-earth metal such as Tb (terbium), Dy (dysprosium), or Gd (gadolinium), and at least one transition metal.

Examples are TbFe, TbCo, TbFeCo, DyTbFeCo, and GdTbCo.
<B>The free layers FM, FM1, and FM2 can be made of the magnetic material having a high coercivity as described above, and can also be made of a magnetic material having a magnetic anisotropic energy density lower than that of the magnetic material having a high coercivity as described above, by adjusting the composition ratio, adding impurities, or adjusting the thickness.

Examples of the material will now be explained.

Example B1

A material obtained by adding an impurity to an alloy containing at least one of Fe, Co, and Ni and at least one of Cr, Pt, and Pd.

Examples of an ordered alloy is Fe(50)Pt(50), Fe(50)Pd (50), or Co(50)Pt(50) with decreased magnetic anisotropic energy density through addition of an impurities such as Cu, Cr, or Ag. An example of a random alloy is a CoCr alloy, CoPt alloy, CoCrPt alloy, CoCrPtTa alloy, or CoCrNb alloy with decreased magnetic anisotropic energy density through increased ratio of a nonmagnetic element therein.

Example B2

A material having a structure in which at least one of Fe, Co, and Ni or an alloy containing one of these elements and one of Pd and Pt or an alloy containing one of these elements are alternately stacked, and the thickness of the layer made of the former element or alloy or the thickness of the layer made of the latter element or alloy is adjusted.

The thickness of the layer made of at least one of Fe, Co, and Ni or an alloy containing one of these elements has the optimum value, and the thickness of the layer made of one of Pd and Pt or an alloy containing one of these elements has the optimum value. The greater the deviation from these optimum values, the smaller the magnetic anisotropic energy density.

Example B3

An amorphous alloy containing at least one rare-earth metal such as Tb (terbium), Dy (dysprosium), or Gd (gadolinium) and at least one transition metal with adjusted composition ratio.

Examples are amorphous alloys such as TbFe, TbCo, TbFeCo, DyTbFeCo, or GdTbCo with decreased magnetic anisotropic energy density through adjustment of the composition ratio.

When using a Co/Pt artificial lattice as the free layers FM, FM1, and FM2, the coercivity of the MTJ element can be controlled by adjusting the thicknesses of Co and Pt.

When using an ordered alloy such as FePt or CoPt as the pinned layer PM, the fct(001) plane must be oriented in order to give them perpendicular magnetic anisotropy. For this purpose, it is favorable to use an ultra-thin underlying layer made of MgO about a few nm thick as a layer for controlling the crystal orientation. Instead of MgO, it is also possible to use an element or compound having the fcc structure or bcc structure whose lattice constant is about 2.8, 4.0, or 5.6 Å. Examples are Pt, Pd, Ag, Au, Al, Cu, Cr, Fe, and their alloys. In the bottom-pin structure, the crystal orientation control layer is formed between a yoke material and the pinned layer. A buffer layer made of, e.g., Ta, TiN, or TaN may also be formed between the crystal orientation control layer and the yoke material. In the top-pin structure, fcc(100)-oriented MgO is preferably used as a barrier layer. In this case, the above-mentioned crystal orientation control layer may also be stacked as long as the MR ratio does not decrease.

An ordered alloy such as FePt or CoPt also needs to be oriented to fct(001) plane in order to be used as the free layers FM, FM1, and FM2. In the top-pin (bottom-free) structure, the crystal orientation control layer is formed between a yoke material and the pinned layer. A buffer layer made of, e.g., Ta, TiN, or TaN may also be formed between the crystal orientation control layer and yoke material. In the bottom-pin (top-free) structure, fcc(100)-oriented MgO is preferably used as the barrier layer. In this case, the above-mentioned crystal orientation control layer may also be stacked as long as the MR ratio does not decrease.

Furthermore, in order to improve the perpendicular magnetism of the pinned layer PM and free layers FM, FM1, and FM2, soft magnetic layers made of, e.g., CoFeB or Fe, may be inserted between these layers and the tunnel barrier layers TB, TB1, and TB2.

[1] That is, a magnetic random access memory according to an aspect of the present invention includes a spin-transfer magnetoresistive effect element which has a stacked structure including a first magnetic layer, a first nonmagnetic layer, a second magnetic layer, a second nonmagnetic layer, and a third magnetic layer, and in which the magnetization direction in the first magnetic layer is fixed along one direction, and in which the magnetization directions in the second and third magnetic layers can be reversed by the spin transfer through current injection at different current densities, and which is able to record and read out data of three or four levels.

The configuration as described above has features [1-1] to [1-5] as follows.

[1-1] The first and second nonmagnetic layers are tunnel barriers, and the stacked structure has a magnetic tunnel junction exhibiting dual tunneling magnetoresistive effects.

[1-2] One of the first and second nonmagnetic layers is a magnetic tunnel junction exhibiting the tunneling magnetoresistive effect, and the other forms a giant magnetoresistive effect element exhibiting the GMR effect.

[1-3] The first, second, and third magnetic layers are magnetized perpendicularly to the film surfaces, the first and third magnetic layers are made of a ferrimagnetic material, and the second magnetic layer is made of a ferromagnetic material.

[1-4] The first, second, and third magnetic layers are made of a ferromagnetic material magnetized parallel to the film surfaces.

[1-5] The stacked structure includes a pinned layer, a first free layer, and a second free layer, and has a first resistance when both the first and second free layers are magnetized parallel to the pinned layer, a second resistance when both the first and second free layers are magnetized antiparallel to the pinned layer, and first and second intermediate resistances when the first and second free layers are magnetized antiparallel to each other. The first intermediate resistance is obtained by supplying the current for making the antiparallel state in the first resistance state. The second intermediate resistance is obtained by supplying the current for making the parallel state in the second resistance state. This achieves selective writing of data of four levels.

[2] A magnetic random access memory according to another aspect of the present invention includes a magnetoresistive effect element which has a stacked structure including a first magnetic layer, a second magnetic layer, a first nonmagnetic layer, a third magnetic layer, a fourth magnetic layer, and a fifth magnetic layer, in which the first and fifth magnetic layers are made of a perpendicularly magnetized ferrimagnetic material, in which the second and fourth magnetic layers are made of a ferromagnetic material, in which an exchange coupling capable of affecting the magnetization directions in the first and second magnetic layers acts between them, in which the second magnetic layer can be magnetized along a direction other than the perpendicular direction by the exchange coupling with the first magnetic layer and the spin transfer through a current injection.

The configuration as described above has features [2-1] to [2-3] as follows.

[2-1] The stacked structure includes a magnetic tunnel junction exhibiting the tunneling magnetoresistive effect, and the second magnetic layer can be magnetized along the in-plane direction by the spin transfer through a current injection as well as magnetized perpendicularly.

[2-2] The stacked structure includes a magnetic tunnel junction exhibiting the tunneling magnetoresistive effect, and the second magnetic layer can be magnetized along a direction different from both the perpendicular direction and in-plane direction by the spin transfer through a current injection.

[2-3] The first and second magnetic layers are different in size.

[3] A magnetic random access memory writing method according to still another aspect of the present invention is for a magnetic tunnel junction element to record data of three- or-more levels as a resistance variation, and the method makes a first state by a first current flowing in a first direction perpendicular to the interface of the magnetic tunnel junction, makes a second state by a second current flowing in a second direction opposite to the first direction, and makes a third state by supplying the first current in the first direction and then a third current smaller than the second current in the second direction.

[4] A magnetic random access memory according to still another aspect of the present invention has a dual TMR structure, records data of three or four levels in accordance with a current direction, includes a stack-structured spin-transfer magnetoresistive effect element including a first magnetic layer, a first nonmagnetic layer, a second magnetic layer, a second nonmagnetic layer, and a third magnetic layer, and including a spin-transfer magnetoresistive effect element which includes a magnetic tunnel junction exhibiting dual tunneling magnetoresistive effects, wherein the first and second nonmagnetic layers are tunnel barriers, the first magnetic layer has magnetization fixed along one direction, and the second and third magnetic layers have magnetization which can be reversed by the spin transfer through a current injection at different current densities, and the memory records and reads out data of three or four levels.

The configuration as described above has features [4-1] to [4-4] as follows.

[4-1] The first and third magnetic layers are ferrimagnetic perpendicular-magnetization films.

[4-2] The first and third magnetic layers are L10 perpendicular-magnetization films.

[4-3] The first and third magnetic layers are in-plane magnetization films.

[4-4] The first and second magnetic layers are different in size.

[5] A magnetic random access memory according to still another aspect of the present invention has a single TMR structure, records data of three or four levels in accordance with a current direction, and includes a spin-transfer magnetoresistive effect element having a stacked structure including a first magnetic layer, a second magnetic layer, a first nonmagnetic layer, a third magnetic layer, wherein the magnetization directions in the third and fourth magnetic layers are reversed by spin transfer through a current injection at different current densities, the stacked structure includes a magnetic tunnel junction having the tunneling magnetoresistive effect, and exchange coupling acts between the first and second magnetic layer, between the second and third magnetic layers, and between the third and fourth magnetic layers, and the memory records and reads out data of three or four levels.

The configuration as described above has features [5-1] to [5-3] as follows.

[5-1] The first and fourth magnetic layers are ferrimagnetic perpendicular magnetization films.

[5-2] One of the first and fourth magnetic layers is an L10 perpendicular-magnetization film, and one of them is a ferrimagnetic perpendicular-magnetization film.

[5-3] An interface layer at the first or fourth magnetic layer side can be magnetized along a direction other than the perpendicular by the exchange coupling with the first or fourth magnetic layer and a spin transfer through a current injection.

[6] A method for performing writing to a magnetic random access memory according to still another aspect of the present invention includes supplying current to a magnetoresistive effect element which has a single or dual TMR structure to write one of four levels, and reading out one of the four levels which correspond to a first, a second, a third, and a fourth states which have correspond resistance in the ascending order, wherein the first state is made by supplying a writing current in a first direction, the fourth state is made by supplying the writing current in a second direction opposite to the first direction, the second state is made by supplying the writing current to the magnetoresistive effect element in the first direction so as to make the first state and then supplying the writing current to the magnetoresistive effect element in the second direction for making the fourth state, and the third state is made by supplying the writing current to the magnetoresistive effect element in the second direction so as to make the fourth state and then supplying the writing current to the magnetoresistive effect element in the first direction for making the first state.

[7] A method for performing writing to a magnetic random access memory according to still another aspect of the present invention includes supplying current to a magnetoresistive effect element which has a single or dual TMR structure to write one of three levels, and reading out one of the three levels which correspond to a first, a second, and a third states which have correspond resistance in the ascending order, wherein the first state is made by supplying a writing current to the magnetoresistive effect element in a first direction, the third state is made by supplying the writing current to the magnetoresistive effect element in a second direction opposite to the first direction, the second state is made by supplying the writing current to the magnetoresistive effect element in the first direction so as to make the first state and then supplying the writing current to the magnetoresistive effect element in the second direction for making the third state, or by supplying the writing current to the magnetoresistive effect element in the second direction so as to make the third state and then supplying the writing current to the magnetoresistive effect element in the first direction for making the first state.

According to an aspect of the present invention as described above, it is possible to fabricate a spin-transfer magnetic random access memory capable of recording and reading out with two terminals, and provide a magnetic random access memory with increased integration per unit area by storing multilevel data in one element, and a writing method of such a memory.

The present invention has been explained above with reference to the first to ninth embodiments. However, the present invention is not limited to those, and can be variously modified on implementation without departing from the spirit and scope of the invention. Also, the above embodiments include inventions in various stages, so various inventions can be extracted by appropriately combining disclosed components. For example, even when some of the components disclosed in the embodiments are omitted, the configuration with such an omission can be extracted as an invention if at least one of the problems described herein can be solved, and at least one of the effects described herein can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
    a first magnetic layer comprising a magnetization fixed along a first direction;
    a first nonmagnetic layer as a first tunnel barrier on the first magnetic layer;
    a second magnetic layer on the first nonmagnetic layer comprising a magnetization whose direction can be reversed by spin transfer through current injection;
    a second nonmagnetic layer as a second tunnel barrier on the second magnetic layer; and
    a third magnetic layer on the second nonmagnetic layer comprising a magnetization whose direction can be reversed by spin transfer through current injection at a current density different from a current density of the second magnetic layer, wherein
    the memory comprises a magnetoresistive effect element in which the first magnetic layer, the first nonmagnetic layer, and the second magnetic layer exhibit a first magnetoresistive effect, the second magnetic layer, the second nonmagnetic layer, and the third magnetic layer exhibit a second magnetoresistive effect, and which is configured to record and read out data of at least three levels based on a synthetic resistance from the first and second magnetoresistive effects.

2. The memory of claim 1, wherein a size of the second magnetic layer and a size of the third magnetic layer are different.

3. The memory of claim 1, wherein the first magnetic layer and the third magnetic layer comprise a ferrimagnetic material magnetized perpendicularly to a film surface, and the second magnetic layer comprises a ferromagnetic material magnetized perpendicularly to the film surface.

4. The memory of claim 1, wherein the first magnetic layer, the second magnetic layer, and the third magnetic layer comprise a ferromagnetic material magnetized parallel to a film surface.

5. The memory of claim 1, wherein the first magnetic layer and the third magnetic layer comprise an L10 film magnetized perpendicularly to a film surface, and the second magnetic layer comprises a ferromagnetic material magnetized perpendicularly to the film surface.

6. A magnetic random access memory comprising:
    a first magnetic layer comprising a magnetization fixed along one direction;
    a second magnetic layer on the first magnetic layer coupled with the first magnetic layer by exchange coupling;
    a nonmagnetic layer as a tunnel barrier on the second magnetic layer;
    a third magnetic layer on the nonmagnetic layer coupled with the second magnetic layer by exchange coupling, comprising a magnetization whose direction can be reversed by spin transfer through current injection; and
    a fourth magnetic layer on the third magnetic layer coupled with the third magnetic layer by exchange coupling, and comprising a magnetization whose direction can be reversed by spin transfer through current injection at a current density different from a current density for the third magnetic layer, wherein the memory comprises a magnetoresistive effect element in which the first magnetic layer, the second magnetic layer, the nonmagnetic layer, the third magnetic layer and the fourth magnetic layer form a magnetic tunnel junction exhibiting tunneling magnetoresistive effect, and configured to record and read out data of at least three levels.

7. The memory of claim 6, wherein a size of the third magnetic layer and a size of the fourth magnetic layer are different.

8. The memory of claim 6, wherein the first magnetic layer and the fourth magnetic layer comprise a ferrimagnetic material magnetized perpendicularly to a film surface, the second magnetic layer comprises a ferromagnetic material magnetized perpendicularly to the film surface, and the third magnetic layer comprises a ferromagnetic material comprising a magnetization whose direction can be directed parallel to the film surface by spin transfer through current injection.

9. The memory of claim 6, wherein the first magnetic layer and the fourth magnetic layer comprise a ferrimagnetic material magnetized perpendicularly to a film surface, the second magnetic layer comprises a ferromagnetic material magnetized perpendicularly to the film surface, and the third magnetic layer comprises a ferromagnetic material comprising a magnetization whose direction can be directed along a direction different from perpendicular and parallel to the film surface by spin transfer through current injection.

10. The memory of claim 6, wherein the first magnetic layer comprises an L10 film magnetized perpendicularly to a film surface, the second magnetic layer comprises a ferromagnetic material magnetized perpendicularly to the film surface, the third magnetic layer comprises a ferromagnetic material comprising a magnetization whose direction can be directed parallel to the film surface by spin transfer through current injection, and the fourth magnetic layer comprises a ferrimagnetic material magnetized perpendicularly to the film surface.

11. The memory of claim 6, wherein the first magnetic layer comprises an L10 film magnetized perpendicularly to a film surface, the second magnetic layer comprises a ferromagnetic material magnetized perpendicularly to the film surface, the third magnetic layer comprises a ferromagnetic material comprising a magnetization whose direction can be directed along a direction different from perpendicular and parallel to the film surface by spin transfer through current injection, and the fourth magnetic layer comprises a ferrimagnetic material magnetized perpendicularly to the film surface.

12. A method for writing data to a magnetic random access memory which comprises a magnetoresistive effect element comprising at least one magnetic tunnel junction configured to indicate tunneling magnetoresistive effect, the method comprising:
supplying current to the magnetoresistive element; and
recording one of four levels which correspond to a first, a second, a third, and a fourth states which correspond to resistance of the magnetoresistive effect element in an ascending order, wherein
the first state is set by supplying a writing current to the magnetoresistive effect element in a first direction;
the fourth state is set by supplying the writing current to the magnetoresistive effect element in a second direction opposite to the first direction;
the second state is set by supplying the writing current to the magnetoresistive effect element in the first direction in order to make the first state, and then supplying the writing current to the magnetoresistive effect element in the second direction; and the third state is set by supplying the writing current to the magnetoresistive effect element in the second direction in order to to make the fourth state, and then supplying the writing current to the magnetoresistive effect element in the first direction.

13. The method of claim 12, wherein the magnetic random access memory comprises:
a first magnetic layer comprising a magnetization fixed along one direction;
a first nonmagnetic layer as a first tunnel barrier on the first magnetic layer;
a second magnetic layer on the first nonmagnetic layer comprising a magnetization whose direction can be reversed by spin transfer through current injection;
a second nonmagnetic layer as a second tunnel barrier on the second magnetic layer; and
a third magnetic layer on the second nonmagnetic layer comprising a magnetization whose direction can be reversed by spin transfer through current injection at a current density different from a current density of the second magnetic layer, wherein
the magnetoresistive effect element exhibits a first magnetoresistive effect with the first magnetic layer, the first nonmagnetic layer, and the second magnetic layer, exhibits a second magnetoresistive effect with the second magnetic layer, the second nonmagnetic layer, and the third magnetic layer, and is configured to record and read out data of four levels based on a synthetic resistance from the first and second magnetoresistive effects.

14. The method of claim 13, wherein a size of the second magnetic layer and a size of the third magnetic layer are different.

15. The method of claim 13, wherein the first magnetic layer and the third magnetic layer comprise a ferrimagnetic material magnetized perpendicularly to a film surface, and the second magnetic layer comprise a ferromagnetic material magnetized perpendicularly to the film surface.

16. The method of claim 13, wherein the first magnetic layer, the second magnetic layer, and the third magnetic layer comprise a ferromagnetic material magnetized parallel to a film surface.

17. The method of claim 13, wherein the first magnetic layer and the third magnetic layer comprise an L10 film magnetized perpendicularly to a film surface, and the second magnetic layer comprises a ferromagnetic material magnetized perpendicularly to the film surface.

18. The method of claim 12, wherein the magnetic random access memory comprises:
a first magnetic layer comprising a magnetization fixed along one direction;
a second magnetic layer on the first magnetic layer coupled with the first magnetic layer by exchange coupling;
a nonmagnetic layer as a tunnel barrier on the second magnetic layer;
a third magnetic layer on the nonmagnetic layer coupled with the second magnetic layer by exchange coupling, and comprising a magnetization whose direction can be reversed by spin transfer through current injection; and
a fourth magnetic layer on the third magnetic layer coupled with the third magnetic layer by exchange coupling, and comprising a magnetization whose direction can be reversed by spin transfer through current injection at a current density different from a current density for the third magnetic layer, wherein
the magnetoresistive effect element forms a magnetic tunnel junction exhibiting a tunneling magnetoresistive effect with the first magnetic layer, the second magnetic layer, the nonmagnetic layer, the third magnetic layer, and the fourth magnetic layer, and is configured to record and read out data of four levels.

19. The method of claim 18, wherein the first magnetic layer and the fourth magnetic layer comprise a ferrimagnetic material magnetized perpendicularly to a film surface, the second magnetic layer comprises a ferromagnetic material magnetized perpendicularly to the film surface, and the third magnetic layer comprises a ferromagnetic material having a magnetization whose direction can be directed parallel to the film surface by spin transfer through current injection.

20. The method of claim 18, wherein the first magnetic layer comprises an L10 film magnetized perpendicularly to a film surface, the second magnetic layer comprises a ferromagnetic material magnetized perpendicularly to the film surface, the third magnetic layer comprises a ferromagnetic material comprising a magnetization whose direction can be directed parallel to the film surface by spin transfer through current injection, and the fourth magnetic layer comprises a ferrimagnetic material magnetized perpendicularly to the film surface.

\* \* \* \* \*